US010923553B2

(12) United States Patent
Mitani

(10) Patent No.: US 10,923,553 B2
(45) Date of Patent: Feb. 16, 2021

(54) DISPLAY DEVICE

(71) Applicant: Sharp Kabushiki Kaisha, Osaka (JP)

(72) Inventor: Masahiro Mitani, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/465,248

(22) PCT Filed: Sep. 26, 2017

(86) PCT No.: PCT/JP2017/034737
§ 371 (c)(1),
(2) Date: May 30, 2019

(87) PCT Pub. No.: WO2019/064342
PCT Pub. Date: Apr. 4, 2019

(65) Prior Publication Data
US 2020/0212155 A1    Jul. 2, 2020

(51) Int. Cl.
| | | |
|---|---|---|
| *H01L 51/52* | (2006.01) | |
| *H01L 27/32* | (2006.01) | |
| *H01L 51/00* | (2006.01) | |
| H01L 51/50 | (2006.01) | |
| H05B 33/10 | (2006.01) | |

(Continued)

(52) U.S. Cl.
CPC ...... *H01L 27/3276* (2013.01); *H01L 51/0097* (2013.01); *G09F 9/30* (2013.01); *H01L 27/32* (2013.01); *H01L 27/3258* (2013.01); *H01L 51/50* (2013.01); *H01L 2251/5338* (2013.01); *H05B 33/10* (2013.01); *H05B 33/12* (2013.01)

(58) Field of Classification Search
CPC . H01L 27/3276; H01L 51/0097; H01L 27/32; H01L 27/3258; H01L 51/50; H01L 2251/5338; H05B 33/10; H05B 33/12; G09F 9/30
See application file for complete search history.

(56) References Cited

U.S. PATENT DOCUMENTS

| | | | | |
|---|---|---|---|---|
| 5,929,948 A | * | 7/1999 | Ohori ............... | G02F 1/136209 349/44 |
| 7,852,443 B2 | * | 12/2010 | Tsuchimichi ..... | G02F 1/133555 349/114 |

(Continued)

FOREIGN PATENT DOCUMENTS

| | | | | |
|---|---|---|---|---|
| CN | 109659372 | * | 4/2019 | ....... H01L 29/66742 |
| JP | 2006-004909 A | | 1/2006 | |

(Continued)

OTHER PUBLICATIONS

English Translation of the Written Opinion, dated Dec. 26, 2017.*
Official Communication issued in International Patent Application No. PCT/JP2017/034737, dated Dec. 26, 2017.

*Primary Examiner* — Mary A Wilczewski
(74) *Attorney, Agent, or Firm* — Keating & Bennett, LLP

(57) ABSTRACT

An active side slit and an FPC side slit each extend through a second inorganic insulating film and reach a first inorganic insulating film. The active side slit is formed between an active region and an IC chip mounted region of an EL device in plan view and also, the IC chip mounted region is sandwiched between the active side slit and the FPC side slit.

20 Claims, 23 Drawing Sheets

(51) Int. Cl.
*G09F 9/30* (2006.01)
*H05B 33/12* (2006.01)

(56) References Cited

U.S. PATENT DOCUMENTS

| | | | | |
|---|---|---|---|---|
| 8,063,865 B2* | 11/2011 | Ishii | G02F 1/136204 | 324/760.01 |
| 9,658,708 B2* | 5/2017 | Misaki | G06F 3/044 | |
| 2001/0028217 A1* | 10/2001 | Kataoka | G02F 1/13439 | 313/506 |
| 2002/0105263 A1* | 8/2002 | Kim | G02F 1/13452 | 313/498 |
| 2003/0038909 A1* | 2/2003 | Ikeno | G02F 1/133555 | 349/113 |
| 2003/0193056 A1* | 10/2003 | Takayama | H01L 27/124 | 257/79 |
| 2005/0030450 A1* | 2/2005 | Okamoto | G02F 1/133555 | 349/113 |
| 2005/0285522 A1 | 12/2005 | Han et al. | | |
| 2006/0220550 A1* | 10/2006 | Harada | H01L 51/5246 | 313/512 |
| 2006/0243989 A1* | 11/2006 | Yamazaki | H01L 51/5253 | 257/79 |
| 2007/0273271 A1 | 11/2007 | Yamazaki et al. | | |
| 2007/0273800 A1* | 11/2007 | Nomura | G02F 1/136227 | 349/38 |
| 2008/0113461 A1* | 5/2008 | Tung | G02F 1/136209 | 438/30 |
| 2008/0230767 A1* | 9/2008 | Jung | H01L 27/1248 | 257/40 |
| 2008/0278666 A1* | 11/2008 | Tsuchimichi | G02F 1/13458 | 349/114 |
| 2009/0153008 A1* | 6/2009 | Yanagisawa | G02F 1/13452 | 313/51 |
| 2010/0201932 A1* | 8/2010 | Gotoh | G02F 1/13439 | 349/141 |
| 2010/0321624 A1* | 12/2010 | Yanagisawa | G02F 1/1345 | 349/152 |
| 2011/0006972 A1* | 1/2011 | Tanaka | H01L 27/3276 | 345/76 |
| 2011/0170274 A1* | 7/2011 | Moriwaki | H01L 24/06 | 361/783 |
| 2011/0222001 A1* | 9/2011 | Umezawa | H01L 27/12 | 349/84 |
| 2011/0234956 A1* | 9/2011 | Umezawa | H01L 27/12 | 349/138 |
| 2011/0234964 A1* | 9/2011 | Moriwaki | G02F 1/13458 | 349/149 |
| 2012/0194772 A1* | 8/2012 | Moriwaki | G02F 1/1339 | 349/138 |
| 2012/0307173 A1* | 12/2012 | Fujita | G02F 1/136286 | 349/43 |
| 2013/0027648 A1* | 1/2013 | Moriwaki | G02F 1/1345 | 349/138 |
| 2013/0249863 A1* | 9/2013 | Misaki | G06F 3/044 | 345/174 |
| 2013/0258614 A1* | 10/2013 | Misaki | H05K 1/0298 | 361/748 |
| 2013/0264573 A1* | 10/2013 | Nagami | H01L 33/42 | 257/59 |
| 2014/0117355 A1* | 5/2014 | Yanagisawa | G02F 1/13458 | 257/48 |
| 2015/0022770 A1* | 1/2015 | Yamaguchi | G02F 1/13454 | 349/139 |
| 2015/0034955 A1* | 2/2015 | Hayashi | H01L 27/1248 | 257/72 |
| 2015/0155305 A1* | 6/2015 | Wu | H01L 29/45 | 257/72 |
| 2015/0187894 A1* | 7/2015 | Watanabe | G02F 1/1368 | 257/43 |
| 2015/0279915 A1* | 10/2015 | Morita | H01L 27/3213 | 257/88 |
| 2016/0013325 A1* | 1/2016 | Kitakado | H01L 29/78618 | 257/43 |
| 2016/0062193 A1* | 3/2016 | Yamayoshi | H01L 29/78636 | 349/43 |
| 2016/0141549 A1* | 5/2016 | Odaka | H01L 27/3276 | 257/40 |
| 2016/0218122 A1* | 7/2016 | Nishino | G02F 1/13452 | |
| 2016/0285048 A1* | 9/2016 | Chung | H01L 27/3293 | |
| 2017/0012243 A1 | 1/2017 | Suzuki et al. | | |
| 2017/0133594 A1 | 5/2017 | Mimura et al. | | |
| 2017/0148855 A1 | 5/2017 | Kaji | | |
| 2017/0194599 A1 | 7/2017 | Furuie | | |
| 2017/0194601 A1 | 7/2017 | Kokame et al. | | |
| 2017/0271423 A1 | 9/2017 | Murai et al. | | |
| 2019/0013494 A1* | 1/2019 | Hanari | H01L 51/5243 | |

FOREIGN PATENT DOCUMENTS

| | | | | |
|---|---|---|---|---|
| JP | 2007-294403 A | | 11/2007 | |
| JP | 2011-018686 A | | 1/2011 | |
| JP | 2017-022007 A | | 1/2017 | |
| JP | 2017-091693 A | | 5/2017 | |
| JP | 2017-123217 A | | 7/2017 | |
| JP | 2017-123257 A | | 7/2017 | |
| JP | 2017-168308 | * | 9/2017 | H01L 27/3276 |
| JP | 2017-168308 A | | 9/2017 | |
| WO | 2016/027547 A1 | | 2/2016 | |
| WO | WO 2019/146115 | * | 8/2019 | H01L 21/32 |

* cited by examiner

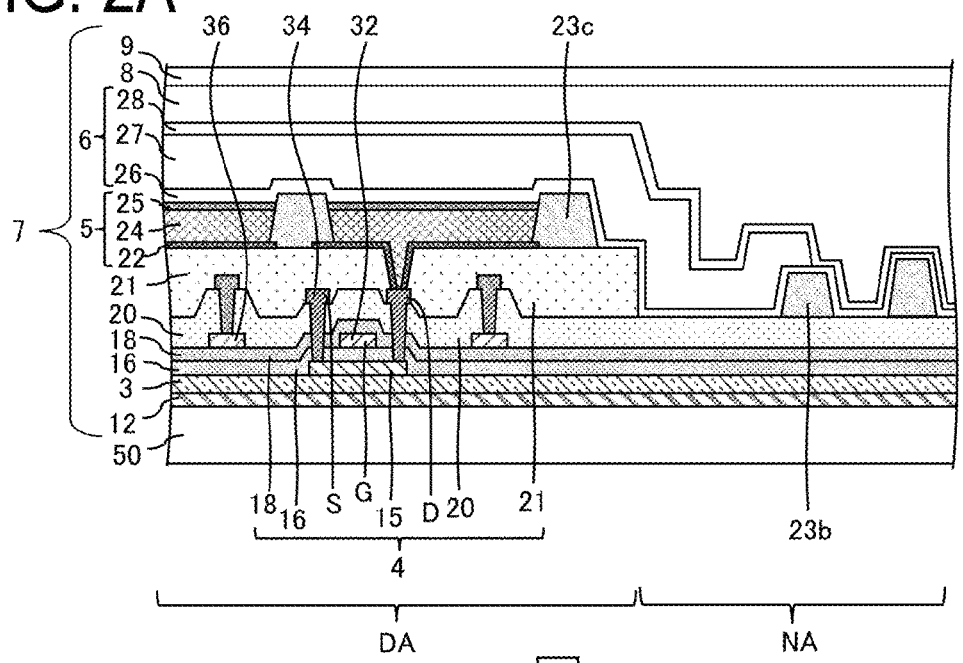
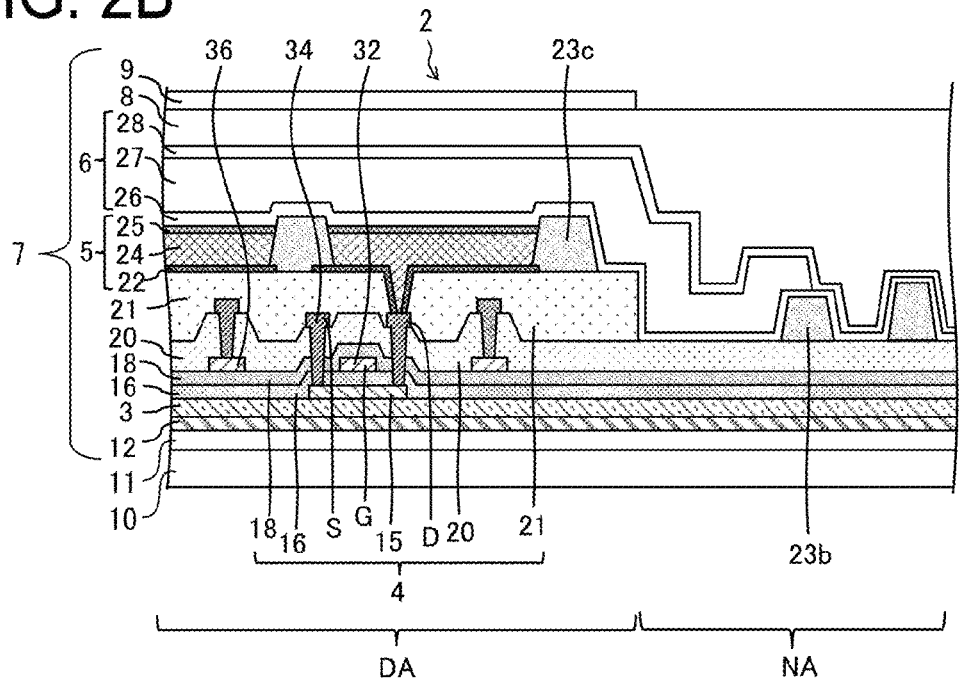

DISPLAY DEVICE

TECHNICAL FIELD

The disclosure is related to a display device.

BACKGROUND ART

PTL 1 discloses a configuration in which a terminal region is provided outside a display region of an organic EL panel.

CITATION LIST

Patent Literature

PTL 1: JP 2011-18686 A (publication date: Jan. 27, 2011)

SUMMARY

Technical Problem

When an IC chip is mounted onto a terminal portion, a crack may occur in the terminal region, and the crack may extend to its surroundings.

Solution to Problem

A display device according to an aspect of the disclosure includes: a TFT layer including a plurality of inorganic insulating films; and a light emitting element layer above the TFT layer, the TFT layer including a terminal region including a plurality of terminals, the terminal region being provided outside an active region. The display device includes a first slit pattern and a second slit pattern each extending through at least one of the plurality of inorganic insulating films. The first slit pattern is formed between the active region and the terminal region in plan view and also, the terminal region is sandwiched between the first slit pattern and the second slit pattern in plan view.

A method for manufacturing a display device according to another aspect of the disclosure is a method for manufacturing a display device including a TFT layer including a plurality of inorganic insulating films and a light emitting element layer above the TFT layer, the TFT layer including a terminal region including a plurality of terminals, the terminal region being provided outside an active region. The method including: forming a first slit pattern extending through at least one of the plurality of inorganic insulating films, between the active region and the terminal region in plan view; and forming a second slit pattern extending through at least one of the plurality of inorganic insulating films to sandwich the terminal region together with the first slit pattern in plan view.

A manufacturing apparatus configured to manufacture a display device according to another aspect of the disclosure is a manufacturing apparatus configured to manufacture a display device including a TFT layer including a plurality of inorganic insulating films and a light emitting element layer above the TFT layer, the TFT layer including a terminal region including a plurality of terminals, the terminal region being provided outside an active region. The manufacturing apparatus is configured to form a first slit pattern extending through at least one of the plurality of inorganic insulating films, between the active region and the terminal region in plan view; and to form a second slit pattern extending through at least one of the plurality of inorganic insulating films to sandwich the terminal region together with the first slit pattern in plan view.

Advantageous Effects of Disclosure

According to one aspect of the disclosure, even in a case where a crack occurs in a terminal region, a first slit pattern and a second slit pattern prevent the crack from extending to its surroundings.

BRIEF DESCRIPTION OF DRAWINGS

FIG. 2A is a cross-sectional view illustrating a configuration example of individual EL devices according to several embodiments of the disclosure during formation, and FIG. 2B is a cross-sectional view illustrating a configuration example of an EL device according to several embodiments of the disclosure.

DESCRIPTION OF EMBODIMENTS

Figure 1:
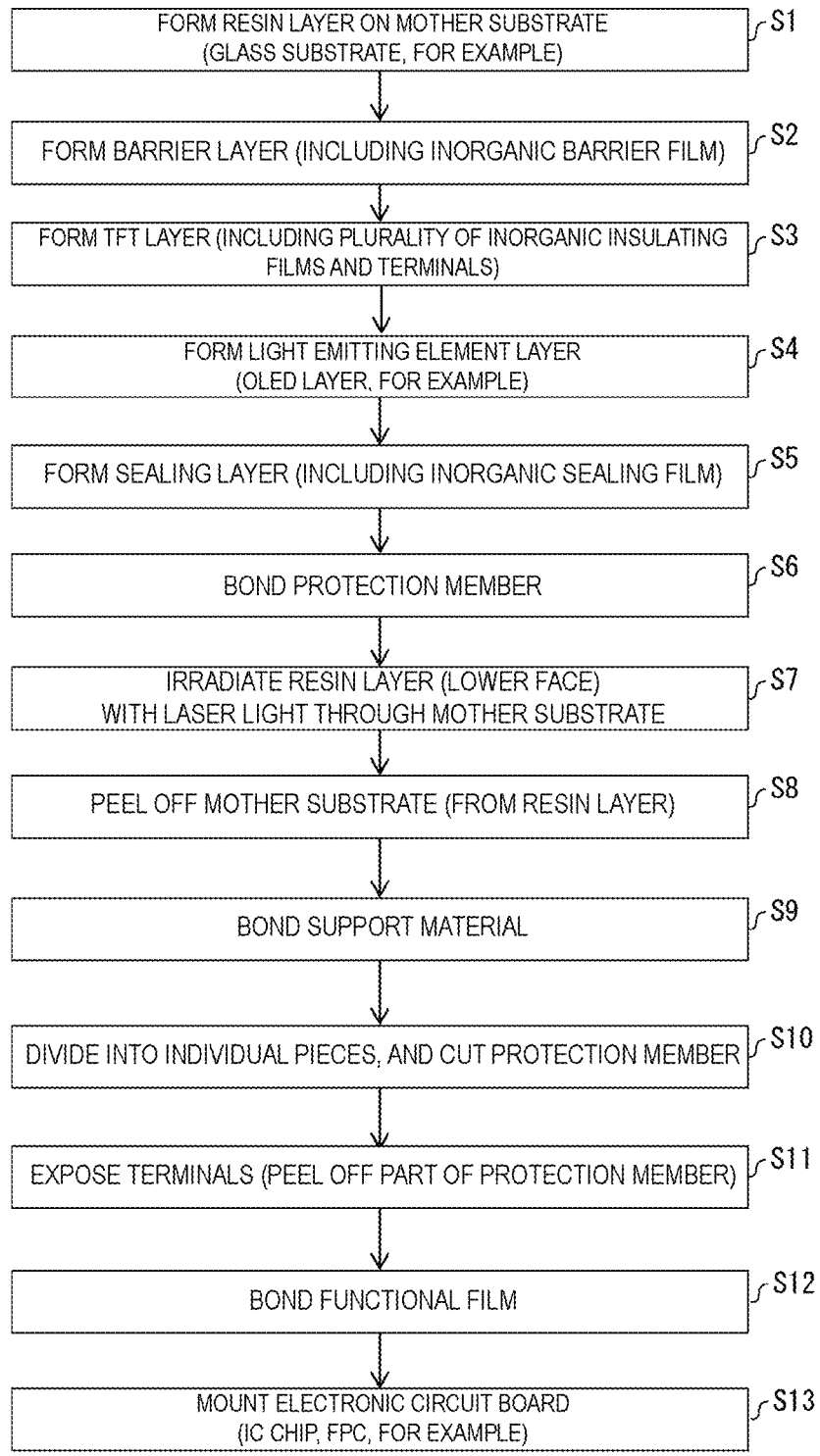
FIG. 1 is a flowchart illustrating an example of a method for manufacturing an EL device.
Figure 3A:
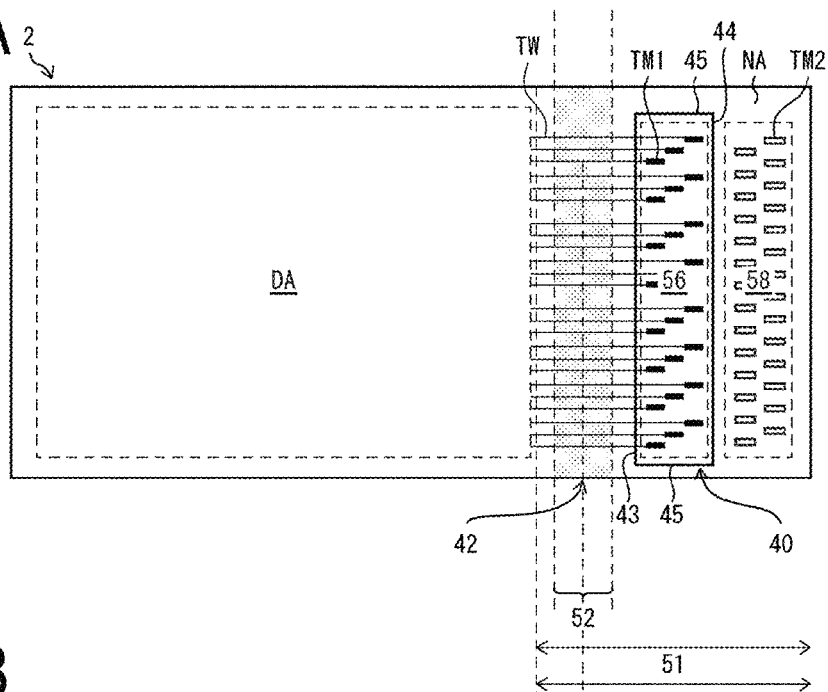
FIG. 3A is a plan view illustrating a configuration example of individual EL devices according to several embodiments of the disclosure.
Figure 3B:
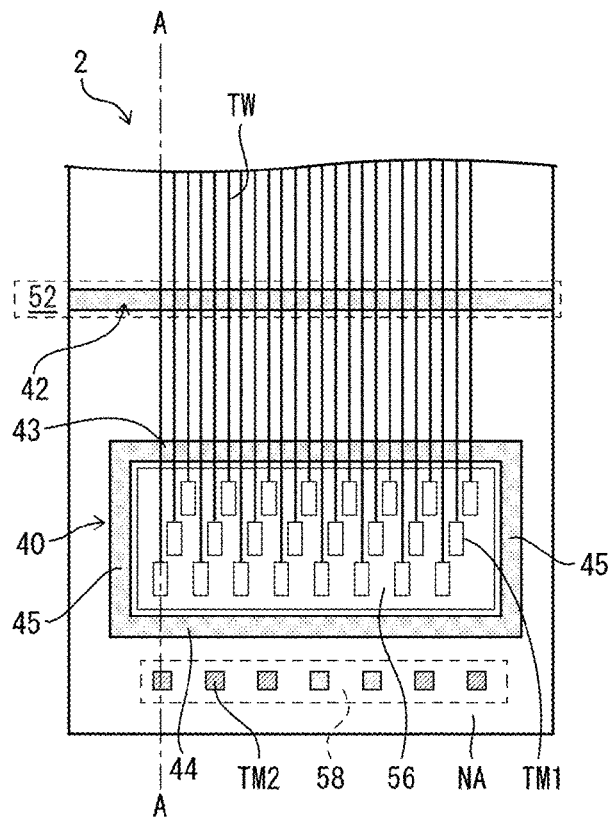
FIG. 3B is a partial plan view focusing on a terminal portion of the configuration example illustrated in FIG. 3A.

FIG. 1 is a flowchart illustrating an example of a method for manufacturing an EL device. FIG. 2A is a cross-sectional view illustrating a configuration example of individual EL devices according to several embodiments of the disclosure during formation. FIG. 2B is a cross-sectional view illustrating a configuration example of individual EL devices according to several embodiments of the disclosure. FIG. 3A is a plan view illustrating a configuration example of individual EL devices according to several embodiments of the disclosure. FIG. 3B is a partial plan view focusing on a terminal portion of the configuration example illustrated in FIG. 3A.

When a flexible display device is manufactured, as illustrated in FIG. 1 and FIGS. 2A and 2B, first, a resin layer 12 is formed on a transparent mother substrate (for example, a glass substrate) 50 (step S1). Next, an inorganic barrier film 3 is formed (step S2). Next, a TFT layer 4 including a semiconductor film 15, a plurality of inorganic insulating films 16, 18, and 20, a flattening film 21, and a plurality of conductive layers 32, 34, and 36 are formed (step S3). Next, a bank layer 23 and a light emitting element layer (for example, an OLED element layer) 5 are formed (step S4). Next, a sealing layer 6 is formed that includes inorganic sealing films 26 and 28 and an organic sealing film 27 (step S5). Next, a protection member 9 (a PET film, for example) is bonded to the sealing layer 6, with an adhesive layer 8 interposed therebetween (step S6).

Next, the resin layer 12 is irradiated with laser light (step S7). Here, by the resin layer 12 absorbing the emitted laser light, the lower face of the resin layer 12 (an interface with a mother substrate 50) changes quality due to ablation, and a peeling layer is formed. This reduces a bonding force between the resin layer 12 and the mother substrate 50. Next, the mother substrate 50 is peeled from the resin layer 12 (step S8). Then, a layered body 7 and the mother substrate 50 illustrated in FIG. 2A are peeled from each other. Here, the layered body 7 refers to the entire multilayer formed on the mother substrate 50, that is, in an example illustrated in FIG. 2A, refers to layers including from the resin layer 12 formed on the mother substrate 50 to a protection member 9, which is the outermost layer.

Next, as illustrated in FIG. 2B, a support member 10 (a PET film, for example) is bonded to the lower face of the resin layer 12, with an adhesive layer 11 interposed therebetween (step S9). Subsequently, the layered body 7 and the support member 10 are separated, and at the same time, the protection member 9 is cut to obtain a plurality of EL devices (step S10). Next, the protection member 9 on a terminal portion 51 (see FIG. 3A) of the TFT layer 4 is peeled off, and terminal exposure is performed (step S11). In this way, an EL device 2 illustrated in FIG. 2B is obtained. After that, a functional film is bonded (step S12), and an electronic circuit board is mounted on the terminal portion 51 using an ACF or the like (step S13). Note that each of the above steps is performed by an EL device manufacturing apparatus.

A feature of the EL device manufacturing method according to one embodiment of the disclosure resides particularly in step S3 and step S9 above. The details thereof will be described below.

Examples of the material of the resin layer 12 include polyimide, epoxy, and polyamide. Among these, polyimide is preferably used.

The inorganic barrier layer 3 is a film configured to prevent water or impurities from reaching the TFT layer 4 or the light emitting element layer 5 when the EL device is being used, and the inorganic barrier layer 3 may be made of a silicon oxide film, silicon nitride film, or silicon oxynitride film formed by CVD, or a layered film thereof, for example. The thickness of the inorganic barrier layer 3 is, for example, from 50 nm to 1500 nm.

The TFT layer 4 includes a semiconductor film 15, an inorganic insulating film 16 (a gate insulating film) formed on the semiconductor film 15, a gate electrode conductive layer 32 formed on the gate insulating film 16, a first inorganic insulating film 18 formed on the gate electrode conductive layer 32, an intermediate conductive layer 36 formed on the first inorganic insulating film 18, a second inorganic insulating film 20 formed on the intermediate conductive layer 36, a source conductive layer 34 formed on the inorganic insulating film 20, and a flattening film 21 formed on the conductive layer 34. In an active region DA of the TFT layer 4, a gate electrode G is formed from the gate conductive layer 32 for each subpixel, and a source electrode S and a drain electrode D are formed from the source conductive layer 34. The semiconductor film 15, the inorganic insulating film 16, the gate electrode G, the inorganic insulating films 18 and 20, the source electrode S, and the drain electrode D constitute a thin film transistor (TFT). In an end portion (non-active region NA) of the TFT layer 4, formed is the terminal portion 51 including terminals TM and terminal wiring lines TW used for connection with an IC chip and an electronic circuit board such as an FPC. The terminals TM are electrically connected to various wiring lines of the TFT layer 4 through the terminal wiring lines TW. The terminals TM and terminal wiring lines TW are formed from one or more of the plurality of conductive layers 32, 34, and 36.

The semiconductor film 15 is made of a low-temperature polysilicon (LTPS) or an oxide semiconductor, for example. The gate insulating film 16 can be formed of, for example, a silicon oxide (SiOx) film, a silicon nitride (SiNx) film, or a layered film thereof formed using a CVD method. The gate electrode G, the source electrode S, the drain electrode D, and the terminal are formed of a metal single layer film or a layered film including, for example, at least one of aluminum (Al), tungsten (W), molybdenum (Mo), tantalum (Ta), chromium (Cr), titanium (Ti), or copper (Cu). Note that, in FIGS. 2A and 2B, the TFT is illustrated that has a top gate structure in which the semiconductor film 15 functions as the channel, but the TFT may have a bottom gate structure (when the channel of the TFT is formed in the oxide semiconductor, for example).

The inorganic insulating films 18 and 20 can be constituted by a silicon oxide (SiOx) film or a silicon nitride (SiNx) film, or a layered film of these, formed using CVD. The flattening film 21 is an organic insulating film and can be made of a coatable photosensitive organic material such as polyimide or acrylic, for example.

The light emitting element layer 5 (an organic light emitting diode layer, for example) includes an anode electrode 22 formed on the flattening film 21, a partition 23c that defines a subpixel of the active region DA, a bank 23b formed in the non-active region NA, an electroluminescence (EL) layer 24 formed on the anode electrode 22, and a cathode electrode 25 formed on the EL layer 24, and a light emitting element (an organic light emitting diode, for example) is configured by the anode electrode 22, the EL layer 24, and the cathode electrode 25.

The partition 23c and the bank 23b may be formed in the bank layer 23 in the same step, for example, using a coatable photosensitive organic material such as polyimide, epoxy, or acrylic. The bank 23b of the non-active region NA is formed on the inorganic insulating film 20. The bank 23b defines the edge of the organic sealing film 27.

The EL layer 24 is formed by vapor deposition or an ink-jet method in a region (subpixel region) enclosed by the partition 23c. In a case that the light emitting element layer 5 is an organic light emitting diode (OLED) layer, for example, the EL layer 24 is formed by layering a hole injecting layer, a hole transport layer, a light emitting layer, an electron transport layer, and an electron injecting layer from the lower layer side.

The anode electrode 22 is photoreflective and is formed by layering Indium Tin Oxide (ITO) and an alloy containing Ag, for example. The cathode electrode 25 may be made of a transparent metal such as Indium Tin Oxide (ITO) or Indium Zinc Oxide (IZO).

In a case that the light emitting element layer 5 is the OLED layer, positive holes and electrons are recombined inside the EL layer 24 by a drive current between the anode electrode 22 and the cathode electrode 25, and light is emitted as a result of excitons that are generated by the recombination falling into a ground state.

The light emitting element layer 5 is not limited to OLED element configurations, and may be an inorganic light emitting diode or a quantum dot light emitting diode.

The sealing layer 6 includes a first inorganic sealing film 26 configured to cover the partition 23c and the cathode electrode 25, an organic sealing film 27 configured to cover the first inorganic sealing film 26, and a second inorganic sealing film 28 configured to cover the organic sealing film 27.

The first inorganic sealing film 26 and the second inorganic sealing film 28 can be each constituted by a silicon oxide film, a silicon nitride film, or a silicon oxynitride film, or by a layered film of these, formed using CVD. The organic sealing film 27 is a transparent organic insulating film that is thicker than the first inorganic sealing film 26 and the second inorganic sealing film 28, and may be formed of a coatable photosensitive organic material such as polymide or acrylic. For example, after coating the first inorganic sealing film 26 with an ink containing such an organic material using the ink-jet method, the ink is cured by UV irradiation. The sealing layer 6 covers the light emitting element layer 5 and inhibits foreign matter, such as water and oxygen, from infiltrating to the light emitting element layer 5.

Note that the protection member 9 is bonded to the sealing layer 6, with the adhesive layer 8 interposed therebetween, and functions as a support member when the mother substrate 50 is peeled off. Examples of a material of the protection member 9 include polyethylene terephthalate (PET).

After the mother substrate 50 has been peeled off, the support member 10 is bonded to the lower face of the resin layer 12 so as to manufacture an EL device having excellent flexibility. Examples of a material of the support member 10 include polyethylene terephthalate (PET). The support member 10 can be selectively removed so as to further provide the EL device 2 with flexibility. For example, a cut-off line is formed in the support member 10 along a target cut-off region before the support member 10 is bonded in step S9, and the support member 10 corresponding to the target region is peeled from the EL device 2 in any one of steps S9 to S13, so that the support member 10 can be selectively removed.

The functional film has an optical compensation function, a touch sensor function, a protective function, and the like, for example. The electronic circuit board is an IC chip or a flexible printed circuit board that is mounted on a plurality of terminals TM, for example.

As illustrated in FIGS. 3A and 3B, the terminal portion 51 includes a bendable region 52 in which the support member 10 is selectively removed, an IC chip mounted region 56 (terminal region) in which terminals TM1 used for connection with the IC chip are arranged in a staggered manner, and an FPC connection region 58 in which terminals TM2 used for connection with the FPC are arranged. The IC chip mounted region 56 is located between the active region DA and the FPC connection region 58, and the bendable region 52 is located between the active region DA and the IC chip mounted region 56. The EL device 2 can bend along the bendable region 52 so that the active region DA faces upward, and the IC chip mounted region 56 and the FPC connection region 58 face downward. This makes an effective width of the terminal portion 51 smaller than the entire width and in turn, reduces a frame portion of a display device including the EL device 2.

The terminal wiring line TW is led from the active region DA and connected to the terminal TM1 in the IC chip mounted region 56.

Figure 19A:
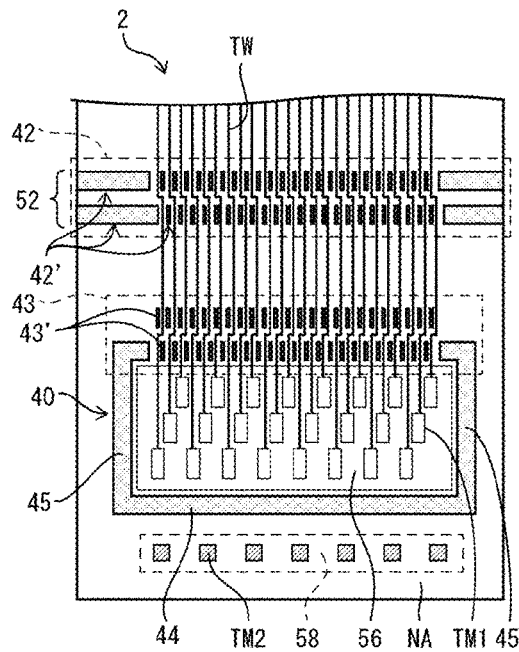
FIGS. 19A to 19C are plan views or partial enlarged views illustrating several modified examples of a configuration of a slit in each of the EL devices according to the other embodiment of the disclosure.
Figure 19B:
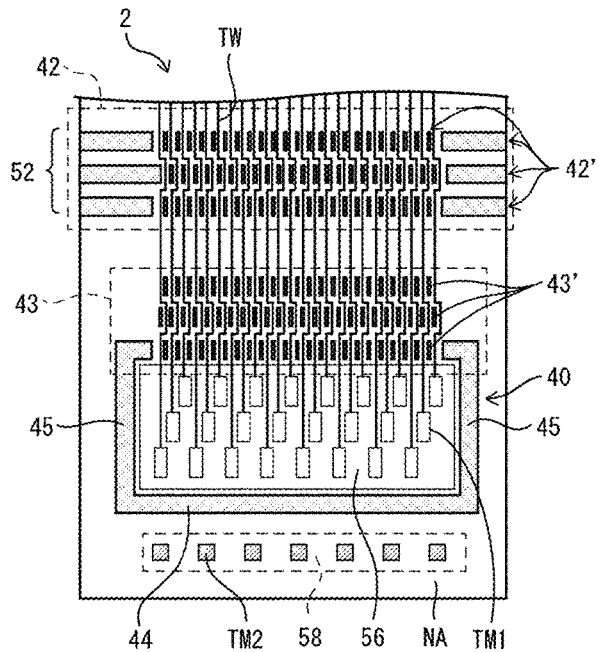
Figure 19C:
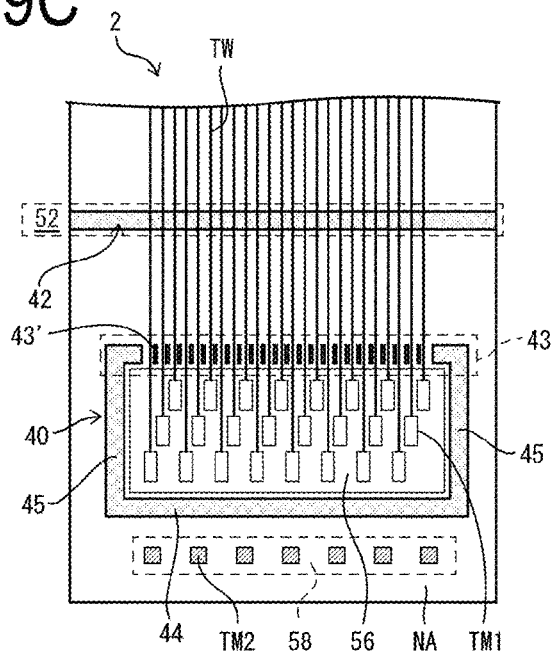

A cutout (groove) having certain width and length is referred to as a slit in this specification. Further, one slit, which continuously extends like a solid line, is referred to as a "continuous slit". Regarding a plurality of slits, which are aligned and spaced like a dotted line, each of the slits is referred to as an "island-like slit", and the plurality of slits are referred to as an "aligned slit group". A direction in which the "aligned slit group" extends is a direction in which the "island-like slits" thereof are aligned. For example, a bending slit 42 illustrated in FIG. 3B and FIG. 19C is a continuous slit. For example, the bending slit 42 illustrated in FIGS. 19A and 19B is an "aligned slit group". Moreover, the slit or slit group, which makes the EL device easily bendable, is referred to as a "bending slit".

First Embodiment

Step S3

Step S3, considered as a feature of one embodiment of the disclosure, will be described.

In step S3, as illustrated in FIGS. 3A and 3B, an IC chip outer circumferential slit 40 is formed so as to surround the IC chip mounted region 56 (terminal region). Moreover, the bending slit 42 (third slit pattern) is formed in the bendable region 52 (bending region) through the same process as a process for the IC chip outer circumferential slit 40.

The IC chip outer circumferential slit 40 includes a continuous active side slit 43 (first slit pattern) located near the active region DA, a continuous FPC side slit 44 (second slit pattern) located near the FPC connection region 58, and two continuous end side slits 45 (two slit patterns) located near the end side of the EL device 2. The active side slit 43 and the FPC side slit 44 extend substantially in parallel to the direction in which the terminal wiring line TW extends. The two end side slits 45 and the bending slit 42 extend substantially orthogonally to the direction in which the terminal wiring line TW extends. In the direction in which the terminal wiring line TW extends, the active region DA, the bendable region 52, the active side slit 43, the IC chip mounted region 56, the FPC side slit 44, and the FPC connection region 58 are arranged in this order. Note that the IC chip outer circumferential slit 40 can include only the active side slit 43 and the FPC side slit 44, not including the end side slit 45.

Figure 4:
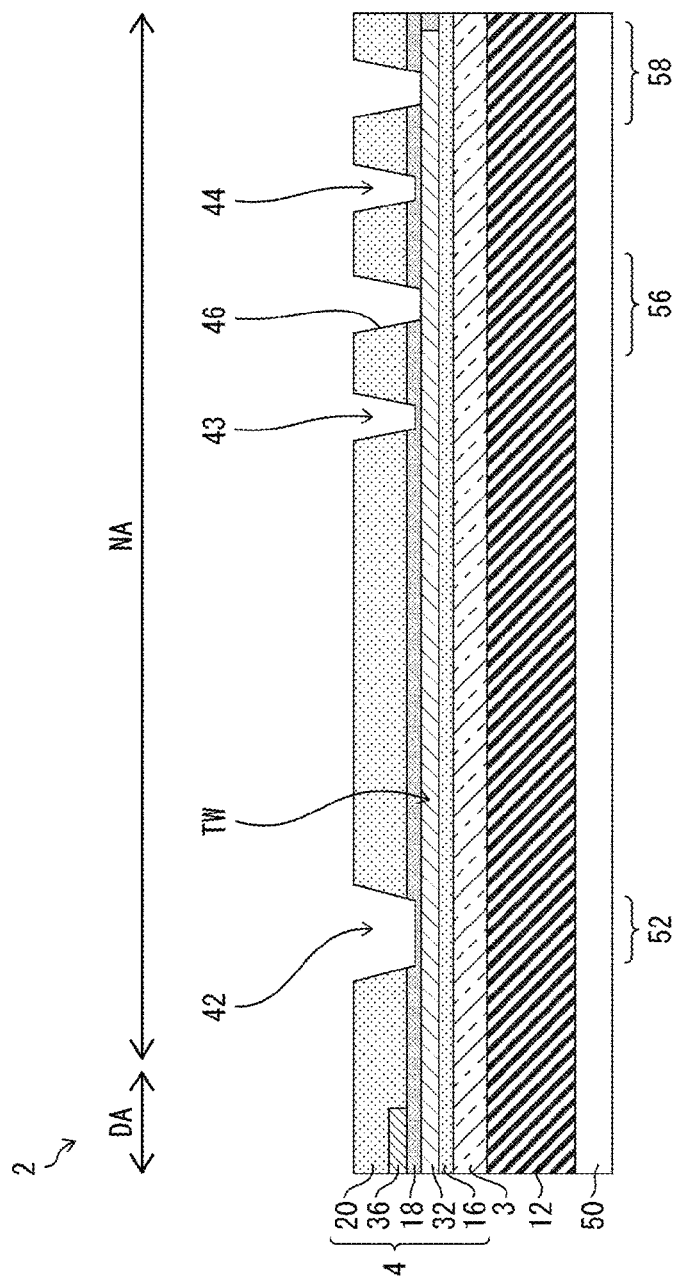
FIG. 4 is a cross-sectional view illustrating a cross-sectional configuration of an EL device before formation of a source conductive layer, according to one embodiment of the disclosure.
Figure 5:
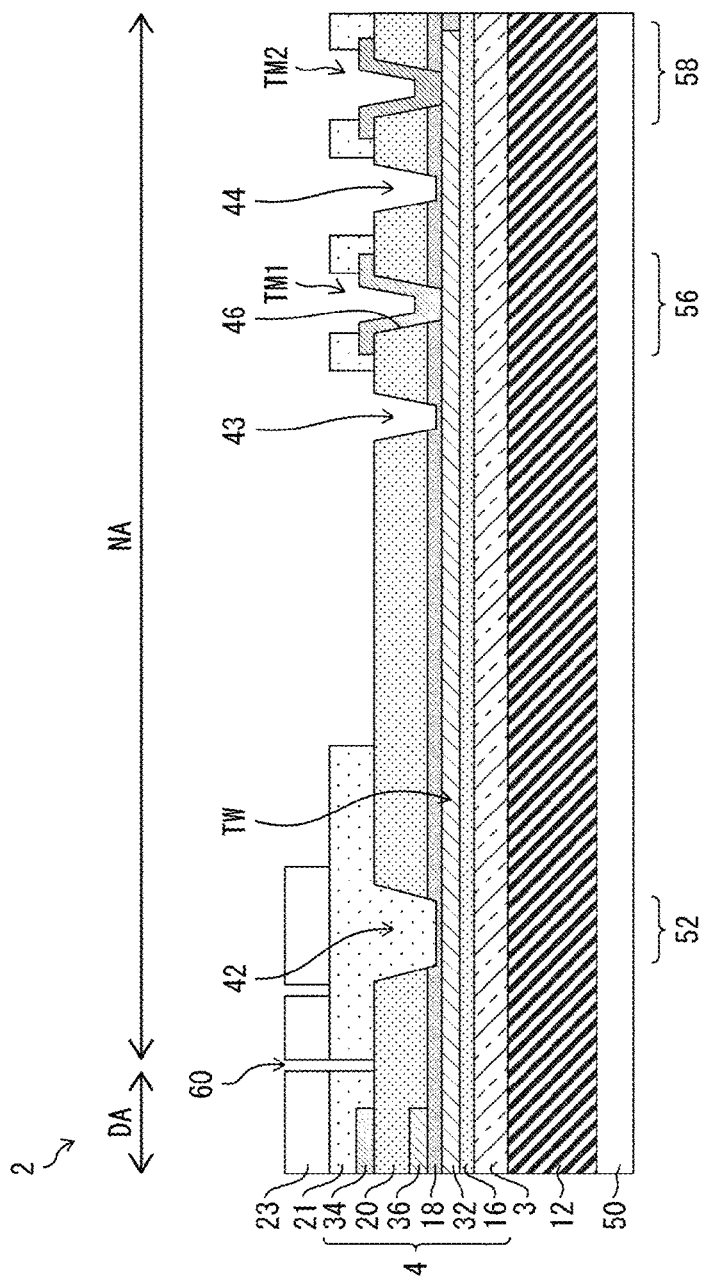
FIG. 5 is a cross-sectional view illustrating a cross-sectional configuration of an EL device after formation of a bank layer, according to the one embodiment of the disclosure.

FIG. 4 is a cross-sectional view illustrating a cross-sectional configuration of the EL device 2 according to the first embodiment before formation of the source conductive layer 34. FIG. 5 is a cross-sectional view illustrating a cross-sectional configuration of the EL device 2 according to the first embodiment after formation of the bank layer 23.

As illustrated in FIGS. 4 and 5, the bending slit 42, the active side slit 43, and the FPC side slit 44 similarly extend through the second inorganic insulating film 20 and reach the first inorganic insulating film 18. Although not illustrated in FIGS. 4 and 5, the end side slits 45 similarly extend through the second inorganic insulating film 20 and reach the first inorganic insulating film 18.

The terminal wiring line TW is made from the gate conductive layer 32 alone. The terminal wiring line TW extends above the resin layer 12 and below the bending slit 42, the active side slit 43, and the FPC side slit 44 (hereinafter collectively referred to as "slits 42 to 44"), crossing the bending slit 42 and the active side slit 43.

As illustrated in FIG. 5, the terminals TM1 and TM2 (i) similarly are in contact with the terminal wiring line TW through a contact hole 46 and (ii) each have an end covered with the flattening film 21 or the bank layer 23.

Step Sequence

The slits 42 to 44, the terminal wiring line TW, and the terminals TM1 and TM2 of FIGS. 4 and 5 can be formed in step 3 through the following step sequence. Note that although a description is omitted, the two end side slits 45 are formed through the same process as a process for the active side slit 43 and the FPC side slit 44.

First, the semiconductor film 15 and the gate insulating film 16 are formed. Next, the gate conductive layer 32 is formed, and the terminal wiring line TW as well as the gate electrode G are made from the gate conductive layer 32. Subsequently, the first inorganic insulating film 18, the intermediate conductive layer 36, and the second inorganic insulating film 20 are formed. Next, the first inorganic insulating film 18 and the second inorganic insulating film 20 are etched so as to form the contact hole 46 for the terminals TM1 and TM2. Subsequently, the source conductive layer 34 is formed, and the terminals TM1 and TM2 as well as the source electrode S and the drain electrode D are made from the source conductive layer 34. Next, the first inorganic insulating film 18 and the second inorganic insulating film 20 are etched again so as to form the slits 42 to 44. Subsequently, the flattening film 21 is formed.

Note that the etching for forming the slits 42 to 44 can be performed at a timing between the formation of the second inorganic insulating film 20 and the formation of the contact hole 46, at a timing between the formation of the contact hole 46 and the formation of the source conductive layer 34, or at the same timing as the etching for forming the contact hole 46. Here, in the latter case, the slits 42 to 44 are formed through etching with the same mask as a mask for the contact hole 46, and the gate conductive layer 32 is exposed at the bottom surface of the slits 42 to 44. Thus, in that latter case, the exposed gate conductive layer 32 can be covered by filling the slits 42 to 44 with the flattening film 21 or other such insulating material.

Accordingly, to prevent shortcircuiting of the terminal wiring line TW, it is preferred to perform the etching for forming the slits 42 to 44 at a timing between the formation of the source conductive layer 34 and the formation of the flattening film 21.

Further, the gate conductive layer 32 preferably functions as an etching stop layer.

Bank Layer

As illustrated in FIG. 5, the bank layer 23 obtained in step 4 is preferably formed on the bending slit 42 so as to reinforce the bendable region 52 of the EL device 2. This is because the bendable region 52 having the bending slit 42 receives a mechanical stress. On the other hand, the bank layer 23 is preferably not formed on the IC chip outer circumferential slit 40 (including the slits 43 and 44). This is because the IC chip outer circumferential slit 40 is located around the IC chip mounted region 56, so that when the bank layer 23 is formed on the IC chip outer circumferential slit 40, the IC chip cannot be easily connected to the terminal TM1.

The slit 60 is preferably formed extending through the flattening film 21 and the bank layer 23, at or around the boundary between the active region DA and the non-active region NA in step 4 or its subsequent steps. This is because the flattening film 21 and the bank layer 23 are organic insulating films; when the slit 60 is not formed, water that has permeated to the flattening film 21 and the bank layer 23 may possibly reach the active region DA from the non-active region NA.

Step S9

Step S9 above, considered as a feature of one embodiment of the disclosure, will be described hereinafter.

Although not illustrated, the support member 10 is selectively removed from the bendable region 52 in step S9 so that the EL device 2 can have flexibility at the bendable region 52. Alternatively, the support member 19 is not selectively bonded to the bendable region 52.

Advantageous Effects

The support member 10 is not bonded to the bendable region 52, and the bending slit 42 reaches the first inorganic insulating film 18 extending through the second inorganic insulating film 20 as illustrated in FIGS. 4 and 5. Thus, the EL device 2 becomes flexible and bendable at the bendable region 52 compared with the non-active region NA other than the bendable region 52.

As illustrated in FIGS. 4 and 5, the terminal wiring line TW passes below the bending slit 42 and the active side slit 43, crossing the bending slit 42 and the active side slit 43. Thus, the bending slit 42 and the active side slit 43 can be each formed as a single continuous slit. This facilitates the formation thereof.

As illustrated in FIGS. 4 and 5, the IC chip outer circumferential slit 40 surrounding the IC chip mounted region 56 reaches the first inorganic insulating film 18 extending through the second inorganic insulating film 20. Thus, even when a strong pressure is applied when mounting the IC chip, for example, and then, a crack occurs in at least one of the first inorganic insulating film 18 and the second inorganic insulating film 20 of the IC chip mounted region 56, the crack does not extend over the IC chip outer circumferential slit 40 and thus is less likely to disconnect the terminal wiring line TW, whereby the EL device 2 maintains its reliability.

Second Embodiment

Step S3, considered as a feature of another embodiment of the disclosure, will be described hereinafter with reference to FIGS. 6 to 8. Note that step S9, considered as a feature of the present embodiment, is the same as step S9 by which the first embodiment is characterized, and therefore, its description is omitted here.

Figure 6:
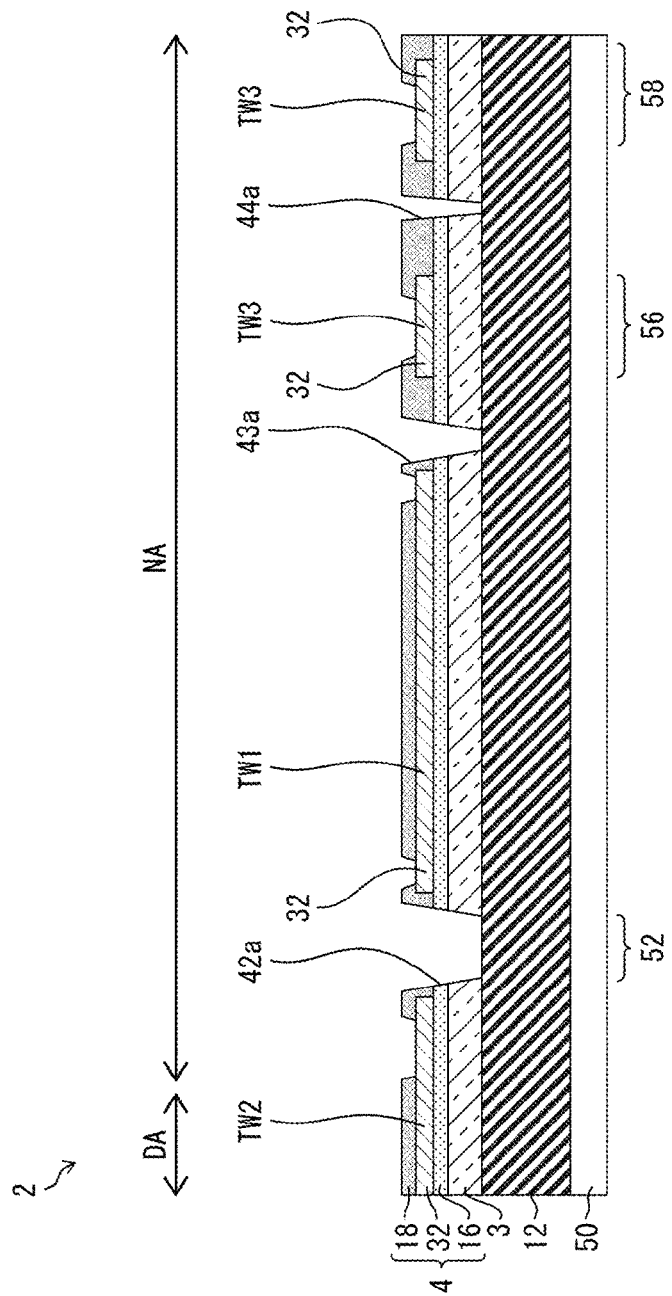
FIG. 6 is a cross-sectional view illustrating a cross-sectional configuration of an EL device before formation of a second inorganic insulating film, according to another embodiment of the disclosure.

FIG. 6 is a cross-sectional view illustrating a cross-sectional configuration of the EL device 2 according to the second embodiment before the formation of the second inorganic insulating film 20. FIG. 7 is a cross-sectional view illustrating a cross-sectional configuration of the EL device 2 according to the second embodiment before the formation of the source conductive layer 34. FIG. 8 is a cross-sectional view illustrating a cross-sectional configuration of the EL device 2 according to the second embodiment after formation of the bank layer 23.

Figure 7:
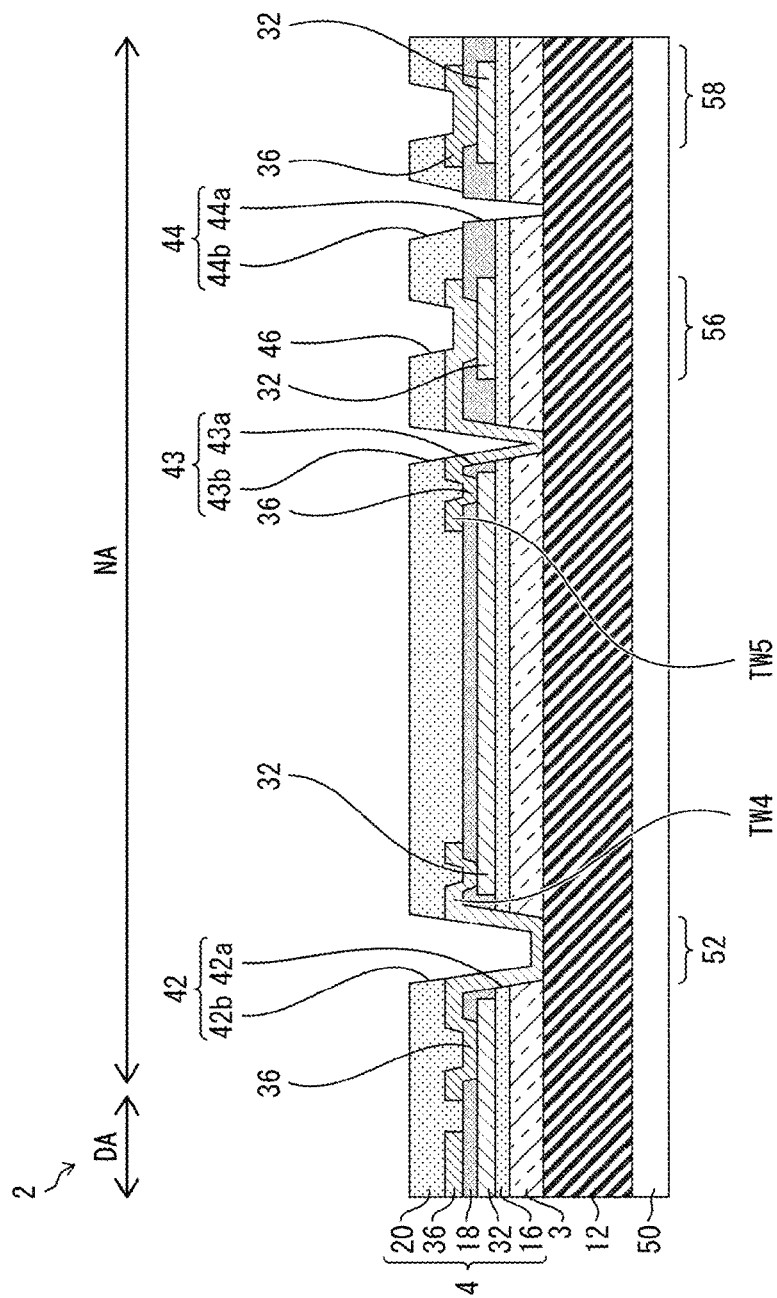
FIG. 7 is a cross-sectional view illustrating a cross-sectional configuration of an EL device before formation of a source conductive layer, according to the other embodiment of the disclosure.
Figure 8:
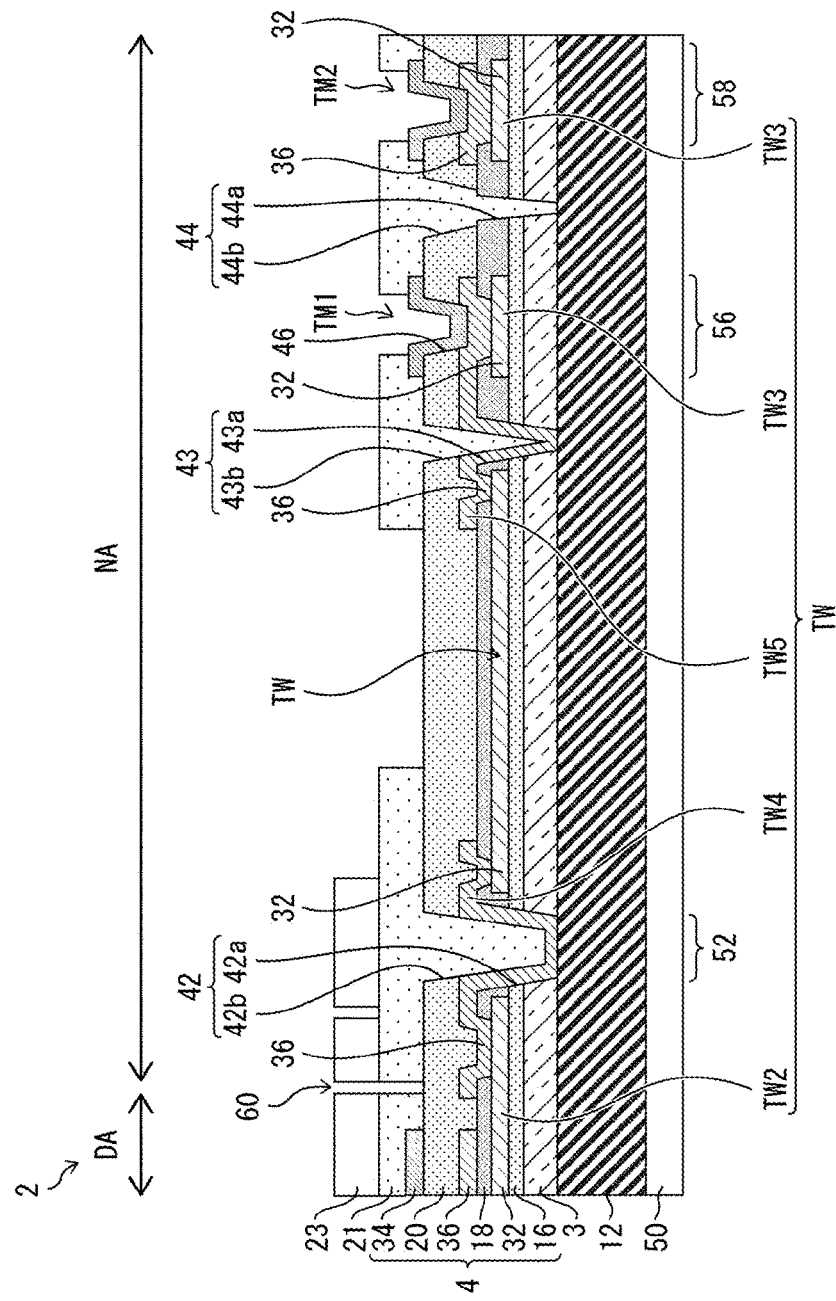
FIG. 8 is a cross-sectional view illustrating a cross-sectional configuration of an EL device after formation of a bank layer, according to the other embodiment of the disclosure.

As illustrated in FIGS. 6 to 8, the bending slit 42 includes a continuous lower bending slit 42a extending through the inorganic barrier film 3, the gate insulating film 16, and the first inorganic insulating film 18, and a continuous upper bending slit 42b extending through the second inorganic insulating film 20. The active side slit 43 similarly includes a continuous lower active side slit 43a extending through the inorganic barrier film 3, the gate insulating film 16, and the first inorganic insulating film 18, and a continuous upper active side slit 43b extending through the second inorganic insulating film 20. The FPC side slit 44 similarly includes a continuous lower FPC side slit 44a extending through the inorganic barrier film 3, the gate insulating film 16, and the first inorganic insulating film 18, and a continuous upper FPC side slit 44b extending through the second inorganic insulating film 20. Although not illustrated in FIGS. 6 to 8, the two end side slits 45 each include a continuous lower end side slit extending through the inorganic barrier film 3, the gate insulating film 16, and the first inorganic insulating film 18 and a continuous upper end side slit extending through the second inorganic insulating film 20.

The terminal wiring line TW includes a main body portion TW1, an active side portion TW2, and a terminal side portion TW3, which are made from the gate conductive layer 32, and a bending slit bridge portion TW4 and an outer circumferential slit bridge portion TW5, which are made from the intermediate conductive layer 36. The bridge portions TW4 and TW5 of the terminal wiring line TW pass inner surfaces and bottom surfaces of the lower bending slit 42a and the lower active side slit 43a, crossing the bending slit 42 and the active side slit 43. To prevent the bridge portions TW4 and TW5 of the terminal wiring line TW from being exposed, the flattening film 21 is formed on the bridge portions TW4 and TW5 of the terminal wiring line TW.

As illustrated in FIG. 8, the terminals TM1 and TM2 (i) similarly are in contact with the terminal side portion TW3 of the terminal wiring line TW through the contact hole 46 and (ii) each have an end covered with the flattening film 21 or the bank layer 23.

Step Sequence

The terminal wiring line TW, the slits 42 to 44, and the terminals TM1 and TM2 illustrated in FIGS. 6 to 8 can be formed in step 3 in accordance with the following step sequence. Note that although a description is omitted, the two end side slits 45 are formed through the same process as a process for the active side slit 43 and the FPC side slit 44.

First, the semiconductor film 15 and the gate insulating film 16 are formed. Subsequently, the gate conductive layer 32 is formed, and the main body portion TW1, the active side portion TW2, and the terminal side portion TW3 of the terminal wiring line TW as well as the gate electrode G are made from the gate conductive layer 32. Next, the first inorganic insulating film 18 is formed. Then, the inorganic barrier film 3, the gate insulating film 16, and the first inorganic insulating film 18 are etched so as to form the lower bending slit 42a, the lower active side slit 43a, and the lower FPC side slit 44a and contact holes for connection between the main body portion TW1, the active side portion TW2, and the terminal side portion TW3 of the terminal wiring line TW and the bridge portions TW4 and TW5. Next, the intermediate conductive layer 36 is formed, and the bridge portions TW4 and TW5 of the terminal wiring line TW are made from the intermediate conductive layer 36. Then, the second inorganic insulating film 20 is formed. Next, the second inorganic insulating film 20 is etched so as to form the contact hole 46 for the terminals TM1 and TM2. After that, the source conductive layer 34 is formed, and the terminals TM1 and TM2 as well as the source electrode S and the drain electrode D are made from the source conductive layer 34. Next, the second inorganic insulating film 20 is etched again to form the upper bending slit 42b, the upper active side slit 43b, and the upper FPC side slit 44b. Subsequently, the flattening film 21 is formed.

Note that the etching for forming the upper bending slit 42b, the upper active side slit 43b, and the upper FPC side slit 44b can be performed, similar to the etching for forming the slits 42 to 44 in the first embodiment above, at a timing between the formation of the second inorganic insulating film 20 and the formation of the contact hole 46 or at a timing between the formation of the contact hole 46 and the formation of the source conductive layer 34, or otherwise at the same timing as the etching for forming the contact hole 46. In this last case, the exposed gate conductive layer 32 can be covered by filling the slits 42 to 44 with the flattening film 21 or other such insulating material.

Moreover, the gate conductive layer 32 and the intermediate conductive layer 36 preferably function as an etching stop layer. To prevent disconnection of the bridge portions TW4 and TW5 of the terminal wiring line TW, the lower bending slit 42a and the lower active side slit 43a are preferably tapered, i.e., reduce their width toward the bottom, and more preferably tapered with a small angle. Further, the etching of the plurality of inorganic insulating layer can be performed in a plurality of steps instead of the single step.

Advantageous Effects

The support member 10 is not bonded to the bendable region 52, and the bending slit 42 extends through the inorganic barrier film 3, the gate insulating film 16, the first inorganic insulating film 18, and the second inorganic insulating film 20 as illustrated in FIGS. 6 to 8. Thus, the EL device 2 becomes flexible and bendable at the bendable region 52 compared with the non-active region NA other than the bendable region 52. Further, the EL device 2 having a configuration illustrated in FIG. 8 is more bendable than the EL device 2 having a configuration illustrated in FIG. 5.

As illustrated in FIGS. 7 and 8, the bridge portions TW4 and TW5 of the terminal wiring line TW pass the inner surfaces and bottom surfaces of the lower bending slit 42a and the lower active side slit 43a, crossing the bending slit 42 and the active side slit 43. Thus, the bending slit 42 and the active side slit 43 can be each formed as a single continuous slit. This facilitates the formation thereof.

As illustrated in FIGS. 6 to 8, the IC chip outer circumferential slit 40 surrounding the IC chip mounted region 56 extends through the inorganic barrier film 3, the gate insulating film 16, the first inorganic insulating film 18, and the second inorganic insulating film 20. Therefore, even when a large pressure is applied when mounting an IC chip, for example, and then, a crack occurs in at least one of the inorganic barrier film 3, the gate insulating film 16, the first inorganic insulating film 18, and the second inorganic insulating film 20 of the IC chip mounted region 56, the crack does not extend over the IC chip outer circumferential slit 40 and thus is not less likely to disconnect the terminal wiring line TW, whereby the EL device 2 maintains its reliability. Further, the EL device 2 having a configuration illustrated in FIG. 8 maintains a higher reliability than the EL device 2 having a configuration illustrated in FIG. 5.

Third Embodiment

Step S3, considered as a feature of another embodiment of the disclosure, will be described hereinafter with reference to FIGS. 9 and 10. Note that step S9, considered as a feature of the present embodiment, is the same as step S9 by which the second embodiment is characterized, and therefore, its description is omitted here.

Figure 9:
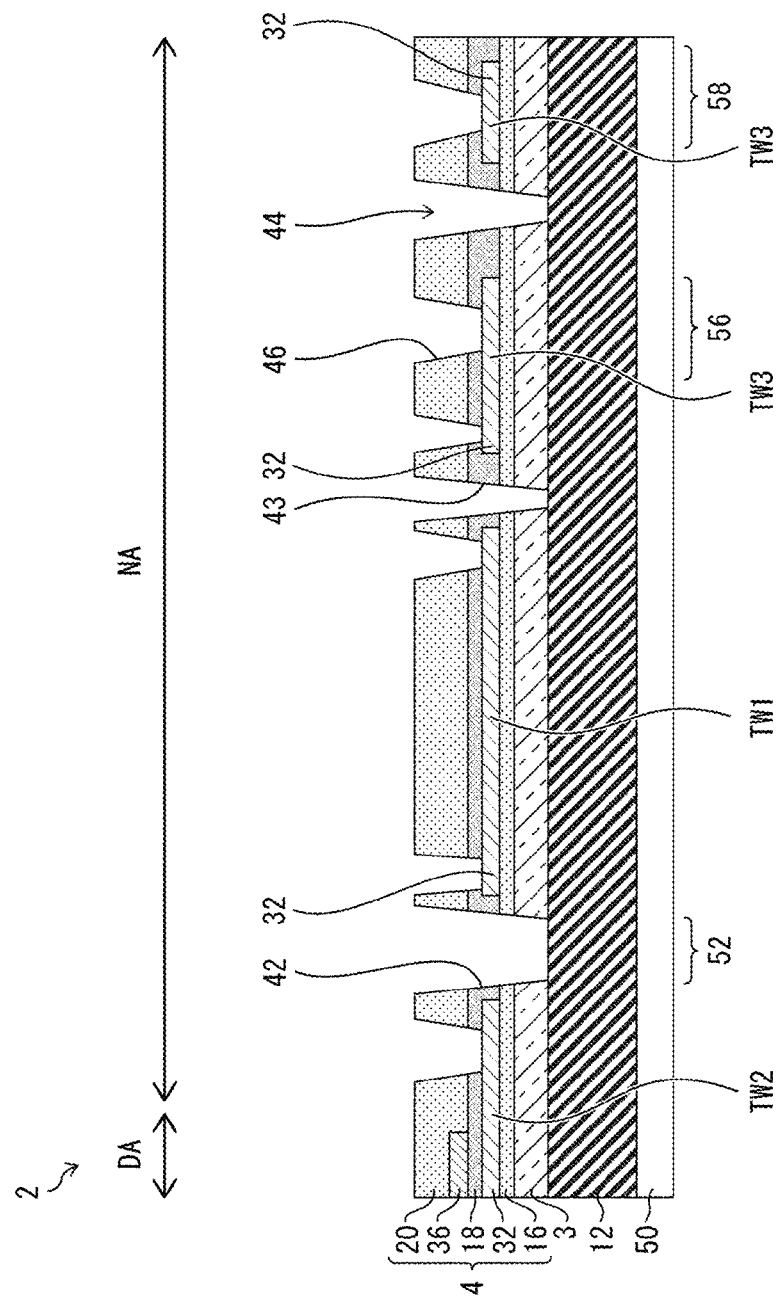
FIG. 9 is a cross-sectional view illustrating a cross-sectional configuration of an EL device before formation of a source conductive layer, according to another embodiment of the disclosure.

FIG. 9 is a cross-sectional view illustrating a cross-sectional configuration of the EL device 2 according to the third embodiment before formation of the source conductive layer 34. FIG. 10 is a cross-sectional view illustrating a cross-sectional configuration of the EL device 2 according to the third embodiment after formation of the bank layer 23.

Figure 10:
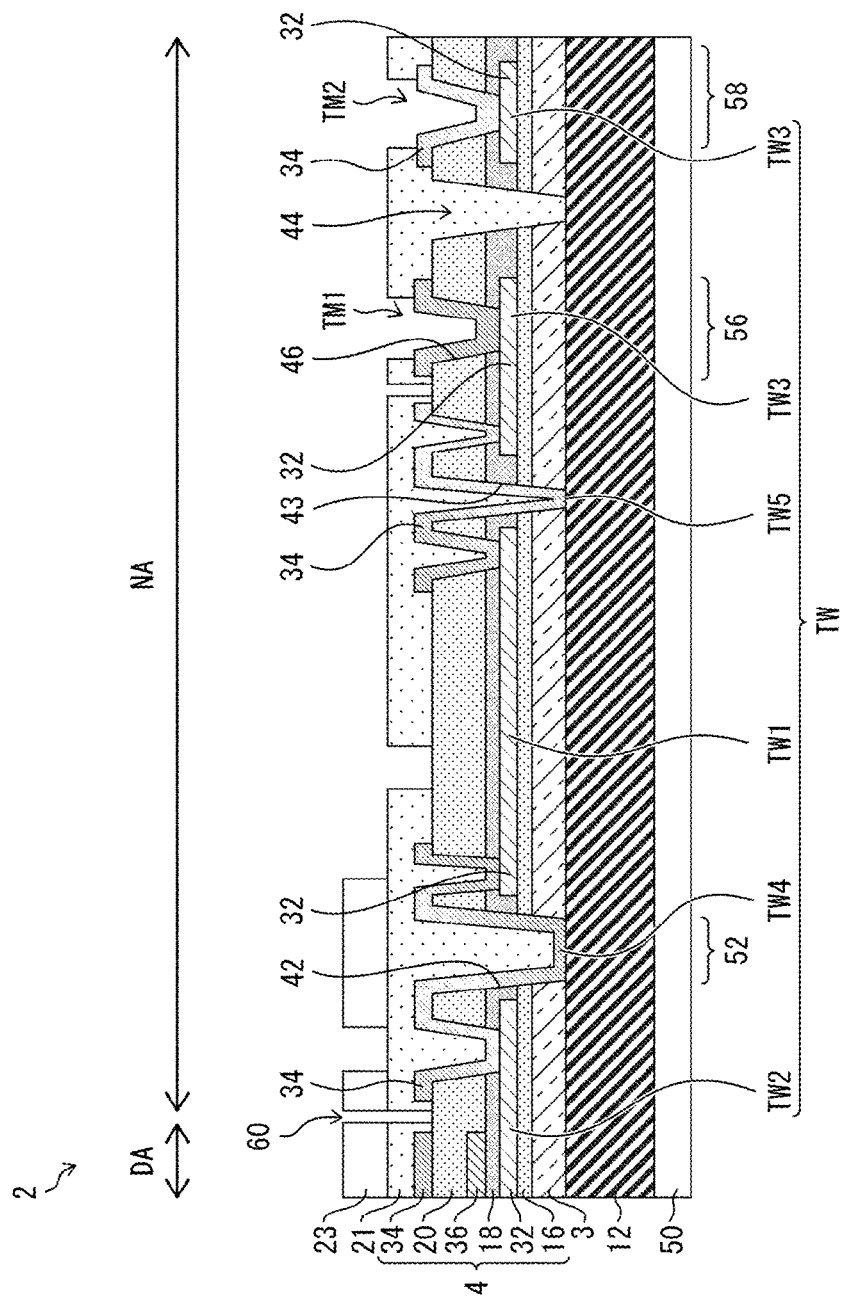
FIG. 10 is a cross-sectional view illustrating a cross-sectional configuration of an EL device after formation of a bank layer, according to the other embodiment of the disclosure.

As illustrated in FIGS. 9 and 10, the bending slit 42, the active side slit 43, and the FPC side slit 44 similarly extend through the inorganic barrier film 3, the gate insulating film 16, the first inorganic insulating film 18, and the second inorganic insulating film 20. Although not illustrated in FIGS. 9 and 10, the two end side slits 45 similarly extend through the inorganic barrier film 3, the gate insulating film 16, the first inorganic insulating film 18, and the second inorganic insulating film 20.

The terminal wiring line TW includes the main body portion TW1, the active side portion TW2, and the terminal side portion TW3, which are made from the gate conductive layer 32, and the bending slit bridge portion TW4 and the outer circumferential slit bridge portion TW5 made from the source conductive layer 34. The bridge portions TW4 and TW5 of the terminal wiring line TW each pass the inner surfaces and bottom surfaces of the bending slit 42 and the active side slit 43, crossing the bending slit 42 and the active side slit 43. To prevent the respective bridge portions TW4 and TW5 of the terminal wiring line TW from being exposed, the flattening film 21 is formed on the bridge portions TW4 and TW5 of the terminal wiring line TW.

As illustrated in FIG. 10, the terminals TM1 and TM2 (i) similarly are in contact with the terminal side portion TW3 of the terminal wiring line TW through the contact hole 46 and (ii) each have an end covered with the flattening film 21 or the bank layer 23.

Step Sequence

The terminal wiring line TW, the slits 42 to 44, and the terminals TM1 and TM2 illustrated in FIGS. 9 and 10 can be formed in step 3 in accordance with the following step sequence. Note that although a description is omitted, the two end side slits 45 are formed through the same process as a process for the active side slit 43 and the FPC side slit 44.

First, the semiconductor film 15 and the gate insulating film 16 are formed. Next, the gate conductive layer 32 is formed, and the main body portion TW1, the active side portion TW2, and the terminal side portion TW3 of the terminal wiring line TW as well as the gate electrode G are made from the gate conductive layer 32. Subsequently, the first inorganic insulating film 18, the intermediate conductive layer 36, and the second inorganic insulating film 20 are formed. Next, the inorganic barrier film 3, the gate insulating film 16, the first inorganic insulating film 18, and the second inorganic insulating film 20 are etched so as to form the bending slit 42, the active side slit 43, and the FPC side slit 44, and contact holes for connection between the main body portion TW1, the active side portion TW2, and the terminal side portion TW3 of the terminal wiring line TW and the bridge portions TW4 and TW5 as well as the contact hole 46 for the terminals TM1 and TM2. Subsequently, the source conductive layer 34 is formed, and the terminals TM1 and TM2 and the bridge portions TW4 and TW5 of the terminal wiring line TW as well as the source electrode S and the drain electrode D are made from the source conductive layer 34. Subsequently, the flattening film 21 is formed.

Moreover, the gate conductive layer 32 and the intermediate conductive layer 36 preferably function as an etching stop layer. Further, to prevent disconnection of the bridge portions TW4 and TW5 of the terminal wiring line TW, the bending slit 42 and the active side slit 43 are preferably tapered, i.e., reduces its width toward the bottom, and more preferably, has a small taper angle at the inner surface.

Advantageous Effects

The EL device 2 having a configuration illustrated in FIG. 10 can provide the same effects as the EL device 2 having a configuration illustrated in FIG. 7.

Moreover, the bending slit 42, the active side slit 43, and the FPC side slit 44 can be formed together with the contact hole 46 for the terminals TM1 and TM2. Thus, it is possible to reduce the number of steps in a method for manufacturing the EL device 2 having a configuration illustrated in FIG. 10 compared with that for the EL device 2 illustrated in FIG. 7.

Fourth Embodiment

Step S3, considered as a feature of another embodiment of the disclosure, will be described hereinafter with reference to FIG. 11. Note that step S9, considered as a feature of the present embodiment, is the same as step S9 by which the second embodiment is characterized, and therefore, its description is omitted here.

Figure 11:
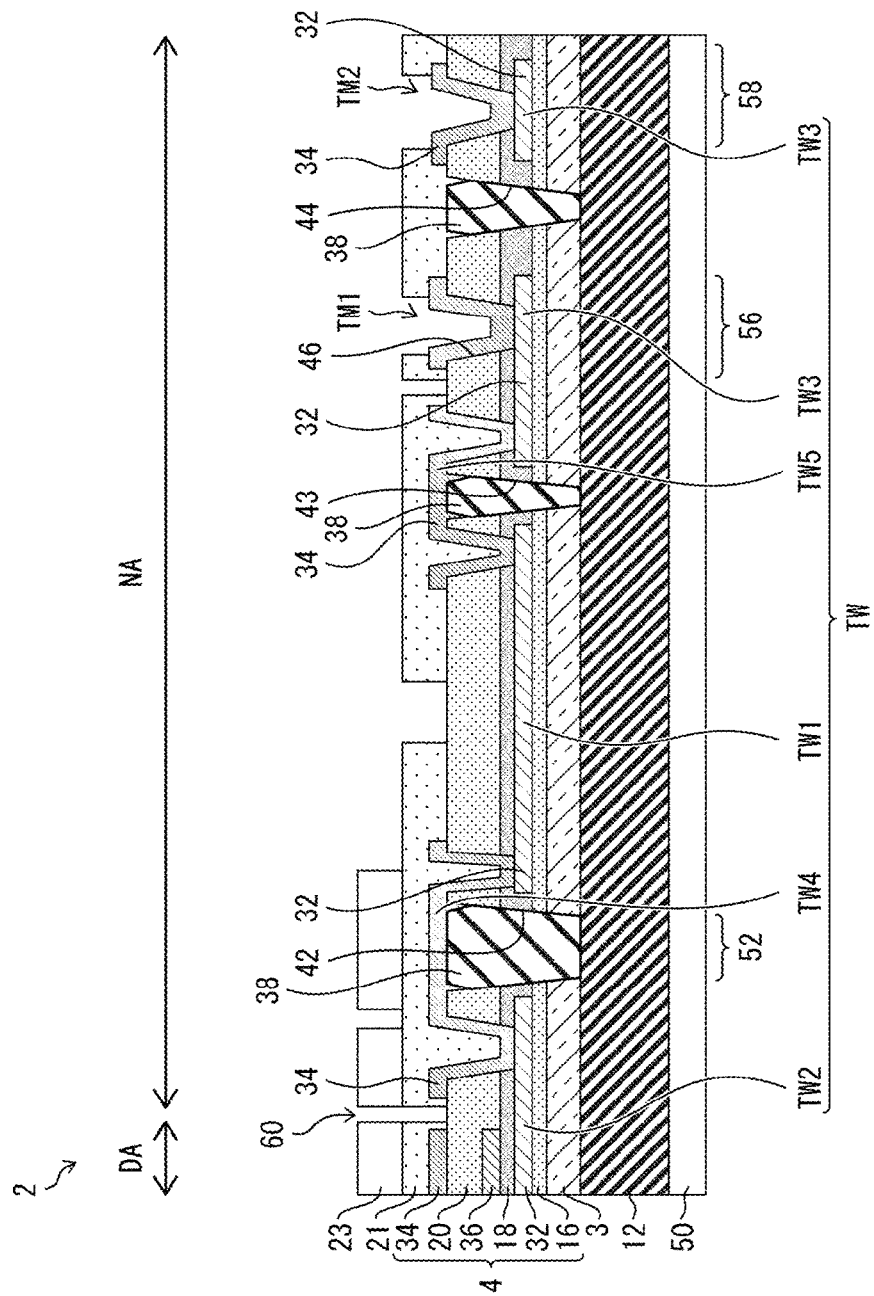
FIG. 11 is a cross-sectional view illustrating a cross-sectional configuration of an EL device according to another embodiment of the disclosure.

FIG. 11 is a cross-sectional view illustrating a cross-sectional configuration of an EL device 2 according to the fourth embodiment.

As illustrated in FIG. 11, the bending slit 42, the active side slit 43, and the FPC side slit 44 similarly extend through the inorganic barrier film 3, the gate insulating film 16, the first inorganic insulating film 18, and the second inorganic insulating film 20. Moreover, although a description is omitted, the two end side slits 45 similarly extend through the inorganic barrier film 3, the gate insulating film 16, the first inorganic insulating film 18, and the second inorganic insulating film 20.

The terminal wiring line TW includes the main body portion TW1, the active side portion TW2, and the terminal side portion TW3, which are made from the gate conductive layer 32, and the bending slit bridge portion TW4 and the outer circumferential slit bridge portion TW5 made from the source conductive layer 34. The bridge portions TW4 and TW5 of the terminal wiring line TW pass above the bending slit 42 and the active side slit 43 and specifically, pass above a buried material 38 filled into the bending slit 42 and the active side slit 43, crossing the bending slit 42 and the active side slit 43.

The buried material 38, which is an organic insulating material, can be made from, for example, a coatable photosensitive organic material such as polyimide and acrylic. The buried material 38 can be made from the same material as or different material from the flattening film 21.

The terminals TM1 and TM2 (i) similarly are in contact with the terminal side portion TW3 of the terminal wiring line TW through the contact hole 46 and (ii) each have an end covered with the flattening film 21 or the bank layer 23.
Step Sequence The terminal wiring line TW and the slits 42 to 44 illustrated in FIG. 11 can be formed in step S3 in accordance with the following step sequence. Note that although a description is omitted, the two end side slits 45 are formed through the same process as a process for the active side slit 43 and the FPC side slit 44.

First, the semiconductor film 15 and the gate insulating film 16 are formed. Next, the gate conductive layer 32 is formed, and the main body portion TW1, the active side portion TW2, and the terminal side portion TW3 of the terminal wiring line TW as well as the gate electrode G are made from the gate conductive layer 32. Subsequently, the first inorganic insulating film 18, the intermediate conductive layer 36, and the second inorganic insulating film 20 are formed. Next, the inorganic barrier film 3, the gate insulating film 16, the first inorganic insulating film 18, and the second inorganic insulating film 20 are etched so as to form the contact hole 46 for the terminals TM1 and TM2, the slits 42 to 44, and the contact holes for connection between the bridge portions TW4 and TW5 and the main body portion TW1, the active side portion TW2, and the terminal side portion TW3 of the terminal wiring line TW. Subsequently, the insides of the bending slit 42 and the active side slit 43 are filled with the buried material 38. Subsequently, the source conductive layer 34 is formed, the terminals TM1 and TM2 and the bridge portions TW4 and TW5 of the terminal wiring line TW as well as the source electrode S and the drain electrode D are made from the source conductive layer 34. Subsequently, the flattening film 21 is formed.

The gate conductive layer 32 and the intermediate conductive layer 36 preferably function as an etching stop layer. The insides of the FPC side slit 44 and the two end side slits 45 may be filled with the buried material 38.

Advantageous Effects

The EL device 2 having a configuration illustrated in FIG. 11 can provide the same effects as the EL device 2 having a configuration illustrated in FIG. 9.

Moreover, according to the configuration illustrated in FIG. 11, the bridge portions TW4 and TW5 of the terminal wiring line TW pass over the buried material 38 with which the bending slit 42 and the active side slit 43 are filled instead of passing the inner surfaces and the bottom surfaces of the bending slit 42 and the active side slit 43. Hence, even in a case where the bending slit 42 and the active side slit 43 have a steep taper angle at their inner surfaces or the bending slit 42 and the active side slit 43 have a large depth, the bridge portions TW4 and TW5 of the terminal wiring line TW are hardly disconnected.

Fifth Embodiment

Step S3, considered as a feature of another embodiment of the disclosure, will be described hereinafter with reference to FIG. 12. Note that step S9, considered as a feature of the present embodiment, is the same as step S9 by which the second embodiment is characterized, and therefore, its description is omitted here.

Figure 12:
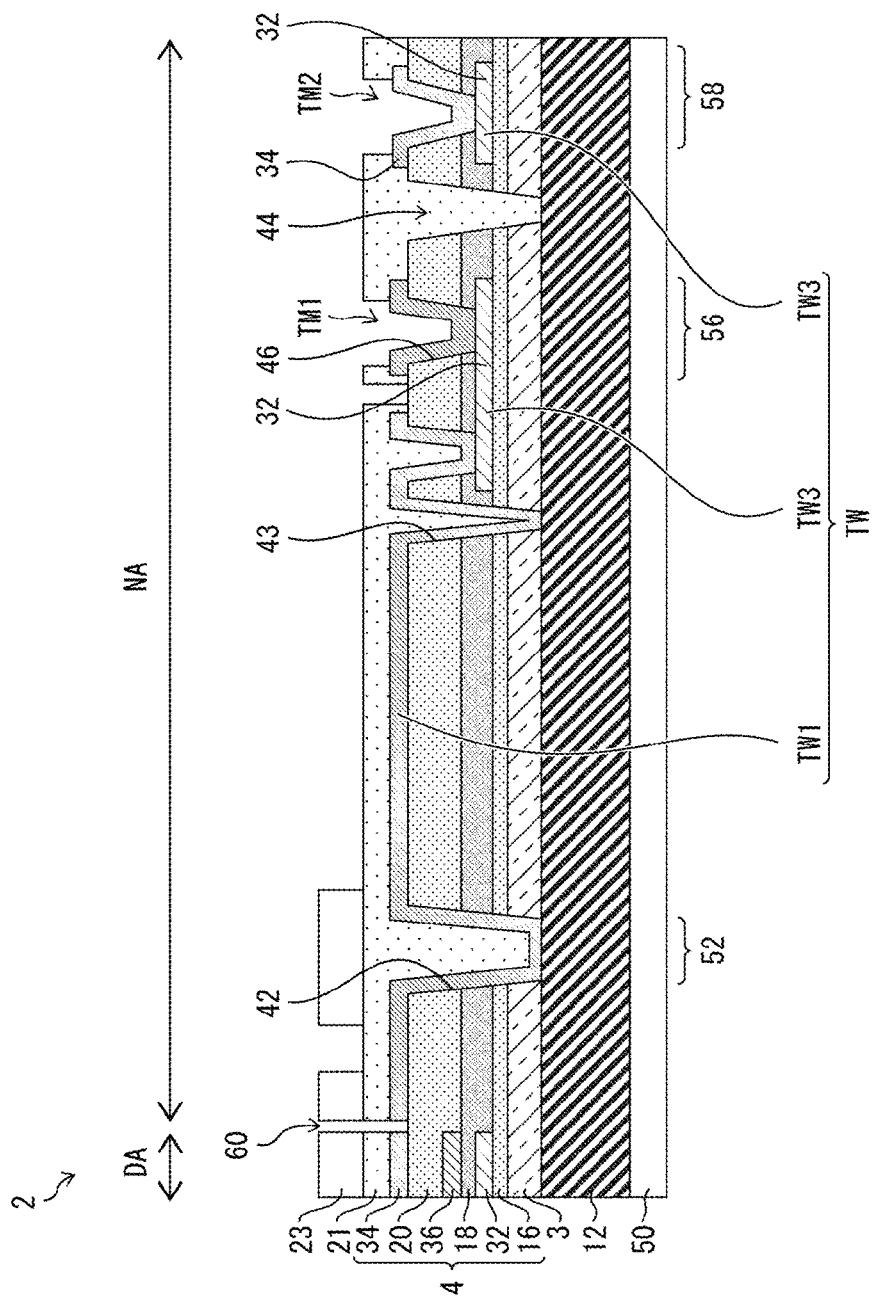
FIG. 12 is a cross-sectional view illustrating a cross-sectional configuration of an EL device according to another embodiment of the disclosure.

FIG. 12 is a cross-sectional view illustrating a cross-sectional configuration of the EL device 2 according to the fifth embodiment.

As illustrated in FIG. 12, the bending slit 42, the active side slit 43, and the FPC side slit 44 similarly extend through the inorganic barrier film 3, the gate insulating film 16, the first inorganic insulating film 18, and the second inorganic insulating film 20. Although not illustrated in FIG. 12, the two end side slits 45 similarly extend through the inorganic barrier film 3, the gate insulating film 16, the first inorganic insulating film 18, and the second inorganic insulating film 20.

The terminal wiring line TW includes the terminal side portion TW3 formed from the gate conductive layer 32 and the main body portion TW1 formed from only the source conductive layer 34. The terminal side portion TW3 of the terminal wiring line TW is provided between the active side slit 43 and the FPC side slit 44, passing below the second inorganic film 20. Thus, the terminal TM1 can come into contact with the terminal wiring line TW inside the TFT layer 4. This prevents the terminal wiring line TW from being exposed in a region having no flattening film 21. The main body portion TW1 of the terminal wiring line TW passes the inner surfaces and the bottom surfaces of the bending slit 42 and the active side slit 43, crossing the bending slit 42 and the active side slit 43.

The terminals TM1 and TM2 (i) similarly are in contact with the terminal side portion TW3 of the terminal wiring line TW through the contact hole 46 and (ii) each have an end covered with the flattening film 21 or the bank layer 23.

Step Sequence

The terminal wiring line TW and the slits 42 to 44 of FIG. 12 can be formed in step 3 through the following step sequence. Note that although a description is omitted, the two end side slits 45 are formed through the same process as a process for the active side slit 43 and the FPC side slit 44.

First, the semiconductor film 15 and the gate insulating film 16 are formed. Subsequently, the gate conductive layer 32 is formed, and the terminal side portion TW3 of the terminal wiring line TW as well as the gate electrode G are formed from the gate conductive layer 32. Subsequently, the first inorganic insulating film 18, the intermediate conductive layer 36, and the second inorganic insulating film 20 are formed. Subsequently, the inorganic barrier film 3, the gate insulating film 16, the first inorganic insulating film 18, and the second inorganic insulating film 20 are etched so as to form the contact hole 46 for the terminals TM1 and TM2, the slits 42 to 44, and contact holes for connection between the terminal side portion TW3 of the terminal wiring line TW and the main body portion TW1. After that, the source conductive layer 34 is formed, and the terminals TM1 and TM2 and the main body portion TW1 of the terminal wiring line TW as well as the source electrode S and the drain electrode D are formed from the source conductive layer 34. Subsequently, the flattening film 21 is formed.

Further, the gate conductive layer 32 preferably functions as an etching stop layer. Further, to prevent the disconnection of the main body portion TW1 of the terminal wiring line TW, the bending slit 42 and the active side slit 43 preferably have a tapered shape, i.e., reduce their widths toward the bottom, more preferably have a small taper angle at their inner surfaces.

Advantageous Effects

The EL device 2 having a configuration illustrated in FIG. 12 can provide the same effects as the EL device 2 having a configuration illustrated in FIG. 10.

Moreover, in the EL device 2 illustrated in FIG. 12, the main body portion TW1 of the terminal wiring line TW (especially, a portion between the active region DA and the active side slit 43) is formed from the source conductive layer 34 having a lower resistance than that of the gate conductive layer 32. Thus, the EL device 2 having a configuration illustrated in FIG. 12 allows a delay in data signal to reduce and in turn, ensures a large margin for design compared with the EL device 2 having a configuration illustrated in FIG. 10.

Sixth Embodiment

Step S3, considered as a feature of another embodiment of the disclosure, will be described hereinafter with reference to FIG. 13. Note that step S9, considered as a feature of the present embodiment, is the same as step S9 by which the second embodiment is characterized, and therefore, its description is omitted here.

Figure 13:
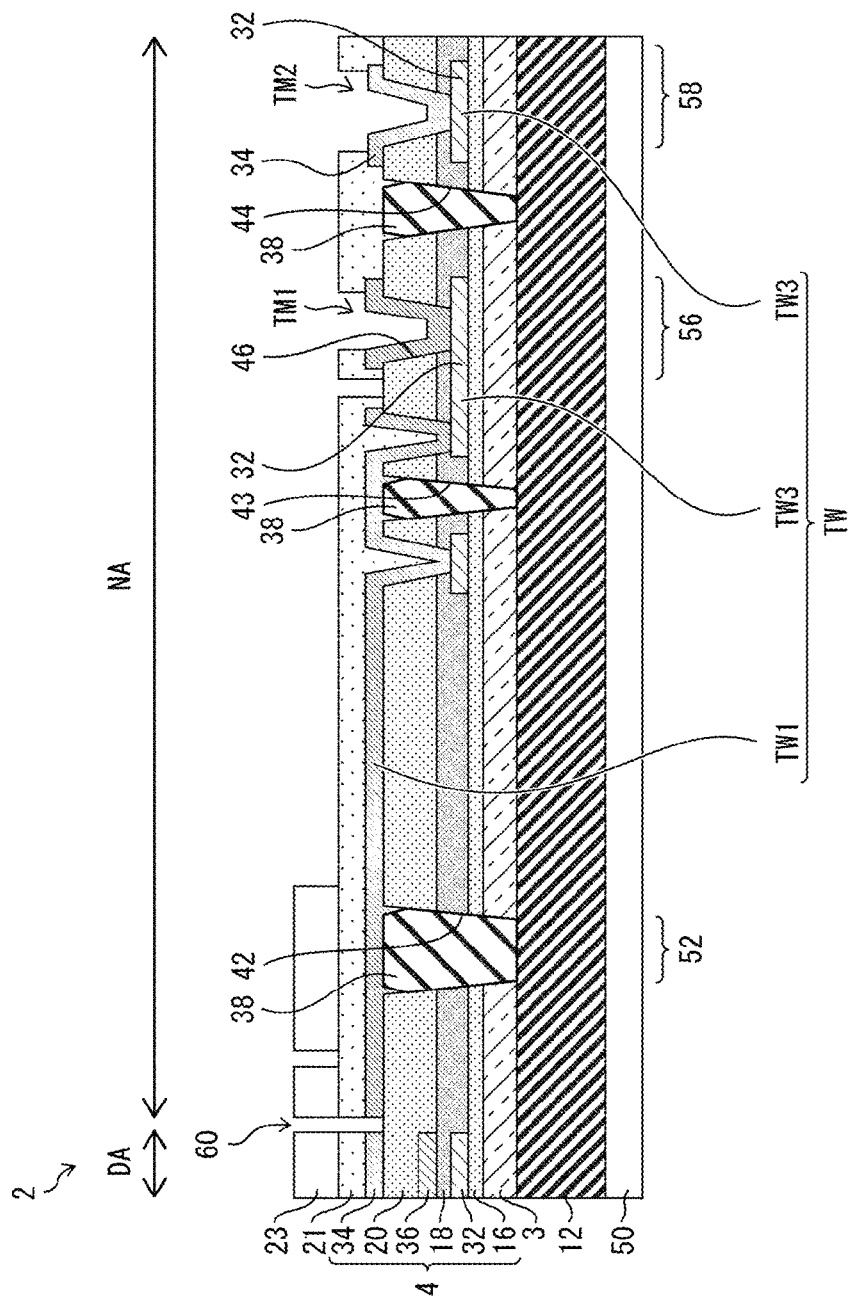
FIG. 13 is a cross-sectional view illustrating a cross-sectional configuration of an EL device according to another embodiment of the disclosure.

FIG. 13 is a cross-sectional view illustrating a cross-sectional configuration of the EL device 2 according to the sixth embodiment.

As illustrated in FIG. 13, the bending slit 42, the active side slit 43, and the FPC side slit 44 similarly extend through the inorganic barrier film 3, the gate insulating film 16, the first inorganic insulating film 18, and the second inorganic insulating film 20. Moreover, although not illustrated in FIG. 13, the two end side slits 45 similarly extend through the inorganic barrier film 3, the gate insulating film 16, the first inorganic insulating film 18, and the second inorganic insulating film 20.

The terminal wiring line TW includes the terminal side portion TW3 formed from the gate conductive layer 32 and the main body portion TW1 formed from only the source conductive layer 34. Since the terminal side portion TW3 of the terminal wiring line TW passes below the second inorganic film 20, the terminal wiring line TW is not exposed at a region having no flattening film 21. The main body portion TW1 of the terminal wiring line TW passes the inner surfaces and the bottom surfaces of the bending slit 42 and the active side slit 43, crossing the bending slit 42 and the active side slit 43.

The terminals TM1 and TM2 (i) similarly are in contact with the terminal side portion TW3 of the terminal wiring line TW through the contact hole 46 and (ii) each have an end covered with the flattening film 21 or the bank layer 23.

Step Sequence

The terminal wiring line TW and the slits 42 to 44 of FIG. 13 can be formed in step 3 through the following step sequence. Note that although a description is omitted, the two end side slits 45 are formed through the same process as a process for the active side slit 43 and the FPC side slit 44.

First, the semiconductor film 15 and the gate insulating film 16 are formed. Subsequently, the gate conductive layer 32 is formed, and the terminal side portion TW3 of the terminal wiring line TW as well as the gate electrode G are formed from the gate conductive layer 32. Subsequently, the first inorganic insulating film 18, the intermediate conductive layer 36, and the second inorganic insulating film 20 are formed. Subsequently, the inorganic barrier film 3, the gate insulating film 16, the first inorganic insulating film 18, and the second inorganic insulating film 20 are etched so as to form the contact hole 46 for the terminal TM, the slits 42 to 44, and contact holes for connection between the terminal side portion TW3 of the terminal wiring line TW and the main body portion TW1. Subsequently, the insides of the bending slit 42 and the active side slit 43 are filled with the buried material 38. After that, the source conductive layer 34 is formed, and the terminals TM1 and TM2 and the main body portion TW1 of the terminal wiring line TW as well as the source electrode S and the drain electrode D are formed from the source conductive layer 34. Subsequently, the flattening film 21 is formed.

The gate conductive layer 32 preferably functions as an etching stop layer. The insides of the FPC side slit 44 and the two end side slits 45 may be filled with the buried material 38.

Advantageous Effects

The EL device 2 having a configuration illustrated in FIG. 13 can provide the same effects as the EL device 2 having a configuration illustrated in FIG. 11.

Moreover, in the EL device 2 having a configuration illustrated in FIG. 13, the main body portion TW1 of the terminal wiring line TW (especially, a portion between the active region DA and the active side slit 43) is formed from the source conductive layer 34 having a lower resistance than that of the gate conductive layer 32. Thus, the EL device 2 having a configuration illustrated in FIG. 13 allows a delay in data signal to reduce and in turn, ensures a large margin for design compared with the EL device 2 having a configuration illustrated in FIG. 11.

Seventh Embodiment

Step S3, considered as a feature of another embodiment of the disclosure, will be described hereinafter with reference to FIGS. 14 to 16. Note that step S9, considered as a feature of the present embodiment, is the same as step S9 by which the second embodiment is characterized, and therefore, its description is omitted here.

Figure 14:
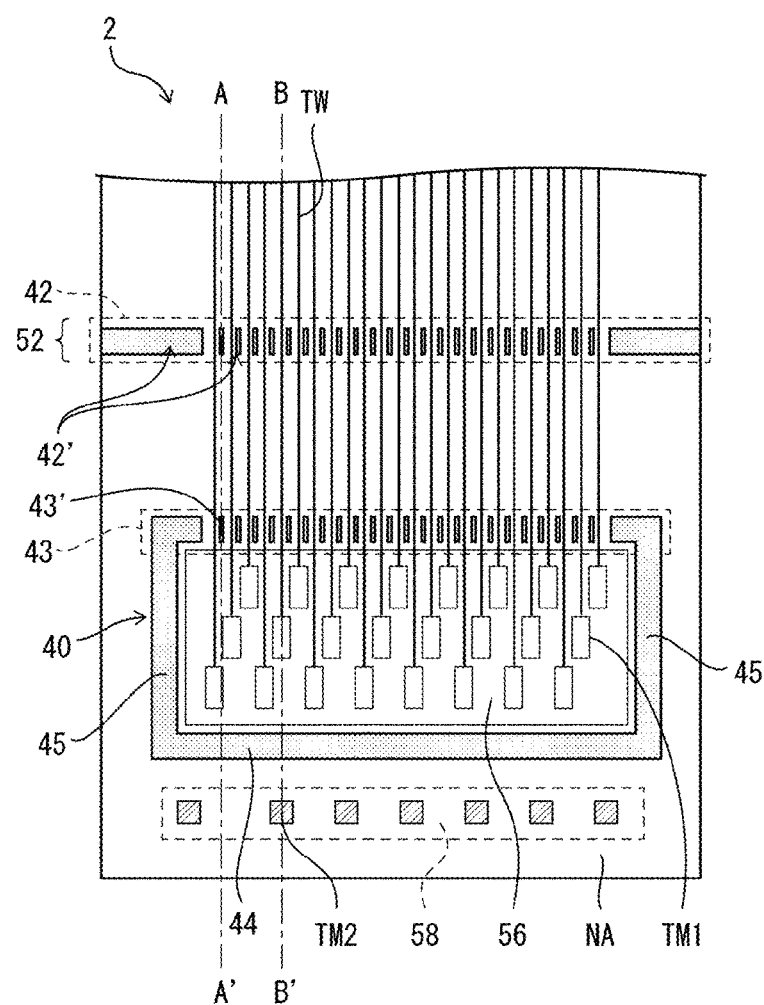
FIG. 14 is a plan view illustrating a configuration example of individual EL devices according to other embodiments of the disclosure.

FIG. 14 is a plan view illustrating a configuration example of the EL device 2 according to the seventh embodiment or the subsequent eighth embodiment.

As illustrated in FIG. 14, the active side slit 43 included in the IC chip outer circumferential slit 40 can include a plurality of island-like slits 43' instead of one continuous slit. For example, it can be one aligned slit group including the island-like slits 43' aligned in a direction crossing the direction in which the terminal wiring line TW extends. The bending slit 42 can similarly include a plurality of island-like slits 42' instead of one continuous slit. That is, it can be one aligned slit group including the island-like slits 42' aligned in a direction crossing the direction in which the terminal wiring line TW extends. The island-like slits 42' and 43' preferably have the length in the direction crossing the terminal wiring line TW, which is shorter than twice the wiring pitch of the terminal wiring line TW and also longer than the wiring pitch of the terminal wiring line TW.

The terminal wiring line TW extends not to overlap (i.e., cross) the bending slit 42 and the active side slit 43 in plan view. Thus, the terminal wiring line TW passes between the island-like slits 42' included in the bending slit 42 and the island-like slits 43' included in the active side slit 43 in plan view. Regarding one aligned slit group included in the bending slit 42, it is preferable that (i) the individual terminal wiring lines TW pass between different pairs of island slits 42' and (ii) the total distance of gaps between the island-like slits 42' be small. Hence, a plurality of island-like slits 42' constituting one aligned slit group included in the bending slit 42 are preferably arranged such that the individual terminal wiring lines TW pass between the different pairs of island-like slits 42' in a one-to-one correspondence. Likewise, a plurality of island-like slits 43' constituting one aligned slit group included in the active side slit 43 are preferably arranged such that the individual terminal wiring lines TW pass between different pairs of island-like slits 43' in a one-to-one correspondence.

Figure 15:
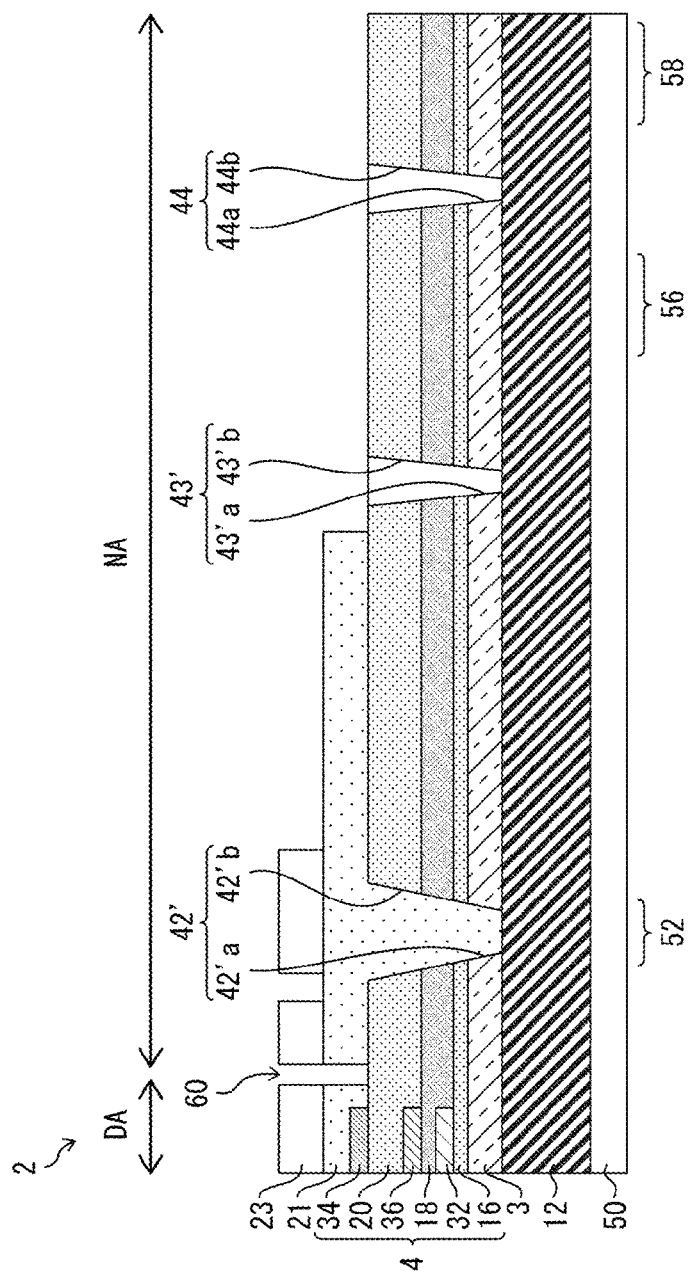
FIG. 15 is a cross-sectional view taken along A-A' line of FIG. 14, which illustrates a cross-sectional configuration of an EL device according to another embodiment of the disclosure.

FIG. 15 is a cross-sectional view taken along A-A' line of FIG. 14, which illustrates a cross-sectional configuration of the EL device 2 according to the seventh embodiment. FIG. 16 is a cross-sectional view taken along B-B' line of FIG. 14, which illustrates a cross-sectional configuration of the EL device 2 according to the seventh embodiment. The A-A' section of FIG. 14 is obtained so as not to include the terminal wiring line TW and so as to include the bending slit 42 and the active side slit 43. Moreover, the B-B' section of FIG. 14 is obtained so as to include the terminal wiring line TW and so as not to include the bending slit 42 and the active side surrounding slit 43.

As illustrated in FIG. 15, the bending slit 42', the active side slit 43', and the FPC side slit 44 similarly extend through the inorganic barrier film 3, the gate insulating film 16, the first inorganic insulating film 18, and the second inorganic insulating film 20. Although not illustrated in FIG. 15, the two end side slits 45 similarly extend through the inorganic barrier film 3, the gate insulating film 16, the first inorganic insulating film 18, and the second inorganic insulating film 20.

Figure 16:
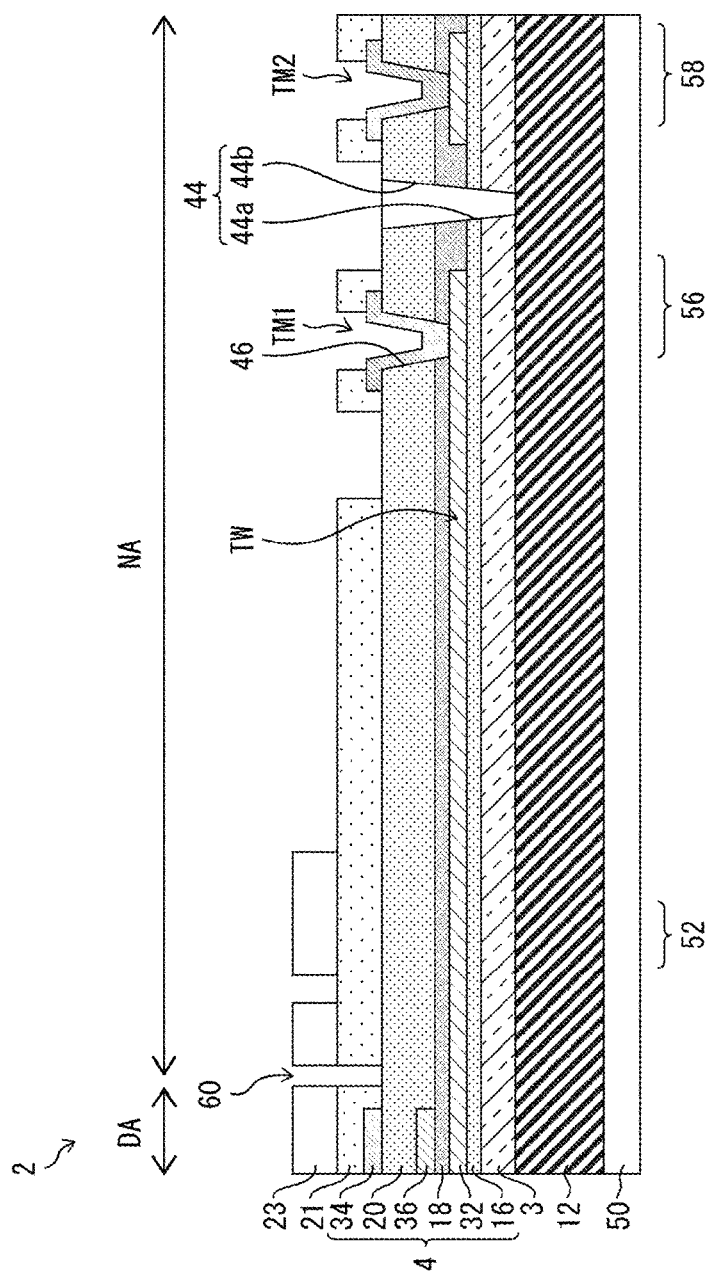
FIG. 16 is another cross-sectional view taken along B-B' line of FIG. 14, which illustrates a cross-sectional configuration of an EL device according to the other embodiment of the disclosure.

As illustrated in FIG. 16, the terminal wiring line TW is formed from only the gate conductive layer 32. The terminal wiring line TW passes between the island-like slits 42' included in the bending slit 42 and between the island-like slits 43' included in the active side slit 43.

The terminals TM1 and TM2 (i) similarly are in contact with the terminal wiring line TW through the contact hole 46 and (ii) each have an end covered with the flattening film 21 or the bank layer 23.

Step Sequence

The terminal wiring line TW, the island-like slits 42' and 43', and the FPC side slit 44 (hereinafter collectively referred to as "slits 42', 43', and 44) of FIGS. 14 to 16 can be formed in step 3 through the following step sequence. Note that although a description is omitted, the two end side slits 45 are formed through the same process as a process for the island-like slit 43' included in the active side slit 43 and the FPC side slit 44.

First, the semiconductor film 15, the gate insulating film 16, the gate conductive layer 32, the first inorganic insulating film 18, the intermediate conductive layer 36, and the second inorganic insulating film 20 are formed. Next, the inorganic barrier film 3, the gate insulating film 16, the first inorganic insulating film 18, and the second inorganic insulating film 20 are etched to form the slits 42', 43', and 44 as well as the contact hole 46 for the terminals TM1 and TM2. After that, the source conductive layer 34 is formed, and the terminals TM1 and TM2 and the terminal wiring line TW as well as the source electrode S and the drain electrode D are formed form the source conductive layer 34. Subsequently, the flattening film 21 is formed.

The gate conductive layer 32 preferably functions as an etching stop layer. Further, the slits 42', 43', and 44 can be each formed, similar to the second embodiment, through two-step etching, one for a lower bending slit 42'a, a lower active side slit 43'a, and a lower FPC side slit 44a and the other for an upper bending slit 42'b, an upper active side slit 43'b, and an upper FPC side slit 44b.

Advantageous Effects

As illustrated in FIGS. 15 and 16, the support member 10 is not bonded to the bendable region 52, and the bending slit 42 extends through the inorganic barrier film 3, the gate insulating film 16, the first inorganic insulating film 18, and the second inorganic insulating film 20. Thus, the EL device 2 becomes flexible and bendable at the bendable region 52 compared with the non-active region NA other than the bendable region 52. Also, the EL device 2 according to the seventh embodiment is bendable than the EL device 2 having a configuration according to the first embodiment.

As illustrated in FIG. 15, the IC chip outer circumferential slit 40 surrounding the IC chip mounted region 56 extends through the inorganic barrier film 3, the gate insulating film 16, the first inorganic insulating film 18, and the second inorganic insulating film 20. Hence, even in a case where a crack occurs in any one or more of the inorganic barrier film 3, the gate insulating film 16, the first inorganic insulating film 18, and the second inorganic insulating film 20 of the IC chip mounted region 56, the crack does not extend over the IC chip outer circumferential slit 40 and thus is less likely to disconnect the terminal wiring line TW, whereby the EL device 2 maintains its reliability. Also, the EL device 2 according to the seventh embodiment maintains higher reliability than the EL device 2 having a configuration according to the first embodiment.

As illustrated in FIGS. 14 and 16, the terminal wiring lines TW pass between the island-like slits 42' included in the bending slit 42 and the island-like slits 43' included in the active side slit 43. Therefore, even in a case where the island-like slits 42' and 43' included in the bending slit 42 and the active side slit 43 have a sharp taper angle at their inner surfaces or have a large depth, the terminal wiring line TW is hardly disconnected.

Accordingly, the EL device 2 having a configuration according to the seventh embodiment can provide the same effects as the EL device 2 having a configuration illustrated in FIG. 9.

Modified Embodiment

FIGS. 19A to 19C are plan views illustrating several modified embodiments of the bending slit 42 and the IC chip outer circumferential slit 40 according to the seventh embodiment or the subsequent eighth embodiment.

As illustrated in FIGS. 19A and 19B, the bending slit 42 and the active side slit 43 can include a plurality of aligned slit groups. Also, the island-like slits 42' and 43' included in the plurality of aligned slit groups are arranged in a staggered manner. Specifically, the island-like slits 42' and 43' each included in the same aligned slit group are aligned in a direction crossing the direction in which the terminal wiring line TW extends. Different aligned slit group is adjacent to the above aligned slit group in the direction in which the terminal wiring TW extends such that the island-like slits 42' and 43' each included in one aligned slit group and the island-like slits 42' and 43' included in different aligned slit group are disposed alternately. As a result, the island-like slits 42' and 43' included in the plurality of aligned slit groups are arranged in a staggered manner. The staggered arrangement is one kind of alternate arrangement. Moreover, the island-like slits 42' and 43' included in the plurality of aligned slit groups are arranged such that a gap between the island-like slits 42' included in a certain aligned slit group and a gap between the island-like slits 43' of a certain aligned slit group out of the plurality of aligned slit groups are blocked by the island-like slits 42' included in another aligned slit group and the island-like slits 43' included in another aligned slit group, respectively, as viewed in the direction in which the terminal wiring line TW extends. Preferably, the island-like slits 42' and 43' included in the plurality of aligned slit groups are arranged such that ends of island-like slits 42' and 43' of a certain aligned slit group out of the plurality of aligned slit groups overlap with those of island-like slits 42' and 43' of another aligned slit group thereof as viewed in the direction in which the terminal wiring line TW extends.

The terminal wiring lines TW circumvent the plurality of staggered island-like slits 42' and 43' so as not to pass into the island-like slits 42' and 43' in plan view. Preferably, the plurality of staggered island-like slits 42' and 43' are disposed such that the individual terminal wiring lines TW pass between a corresponding pair of island-like slits 42' and 43' constituting each aligned slit group in a one-to-one correspondence.

The bending slit 42 including a plurality of aligned slit groups makes the EL device 2 more flexible than that including a single aligned slit group. Thus, the EL device 2 more easily bends at the bendable region 52.

The active side slit 43 including a plurality of aligned slit groups allows the EL device 2 to maintain its reliability compared with a case that the active side slit 43 includes a single aligned slit group. This is because even when a crack occurs in any one or more of the inorganic barrier film 3, the gate insulating film 16, the first inorganic insulating film 18, and the second inorganic insulating film 20 of the IC chip mounted region 56 and spreads through between the island-like slits 43' included the inner aligned slit group, the outer aligned slit group can block the spreading of the crack.

Alternatively, as illustrated in FIG. 19C, the bending slit 42 being a single continuous slit and the active side slit 43 including one or more aligned slit groups can be combined. In this case, the terminal wiring lines TW crossing the bending slit 42 can have a configuration similar to a configuration described in any of the first embodiment (see FIGS. 4 and 5), the second embodiment (see FIGS. 6 to 8), the third embodiment(see FIGS. 9 and 10), and the fourth embodiment (see FIG. 11).

The bending slit 42 being a single continuous slit can make the EL device 2 more flexible than that being a single aligned slit group. Thus, the EL device 2 more easily bends at the bendable region 52. Further, the bending slit 42 being a single continuous slit can be formed in a narrower bendable region 42 than that including a plurality of aligned slit groups. Therefore, an effective width of the terminal portion 51 can be reduced.

Eighth Embodiment

Step S3, considered as a feature of another embodiment of the disclosure, will be described hereinafter with reference to FIGS. 14, 17, and 18. Note that step S9, considered as a feature of the present embodiment, is the same as step S9 by which the second embodiment is characterized, and therefore, its description is omitted here.

Figure 17:
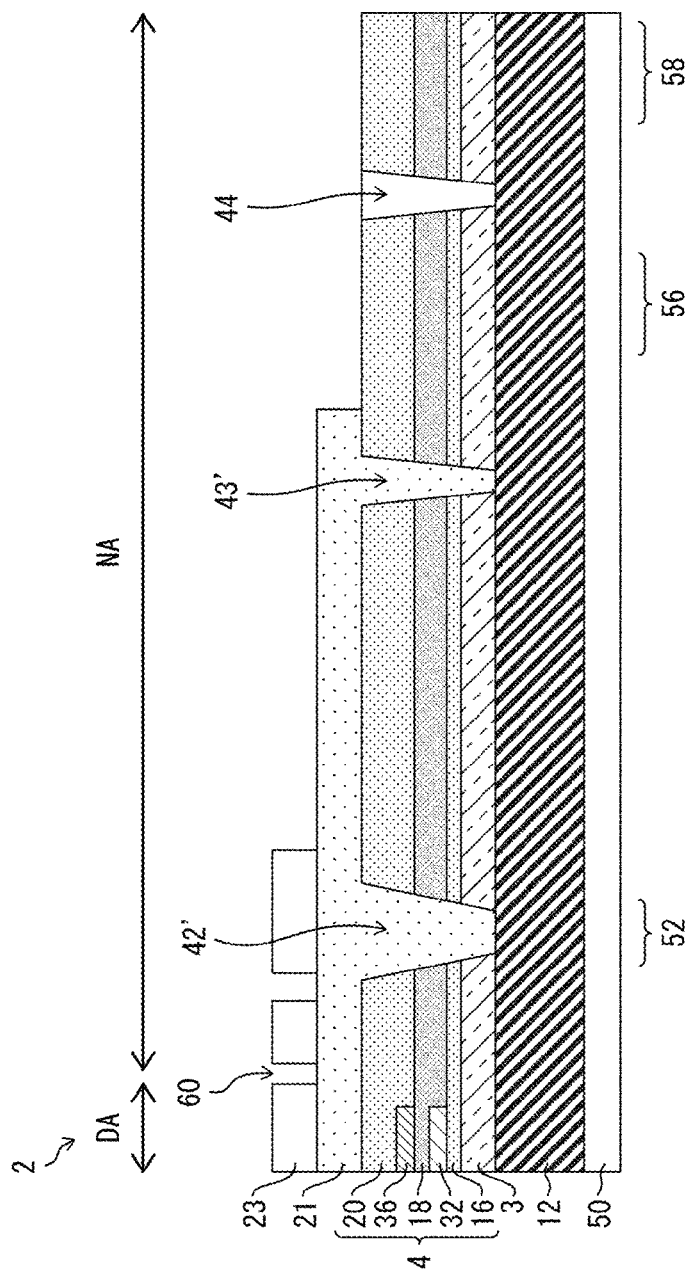
FIG. 17 is a cross-sectional view taken along A-A' line of FIG. 14, which illustrates a cross-sectional configuration of an EL device according to another embodiment of the disclosure.

FIG. 17 is a cross-sectional view taken along A-A' line of FIG. 14, which illustrates a cross-sectional configuration of the EL device 2 according to the eighth embodiment. FIG. 18 is another cross-sectional view taken along B-B' line of FIG. 14, which illustrates a cross-sectional configuration of the EL device 2 according to the eighth embodiment.

As illustrated in FIG. 17, slits 42', 43', and 44 similarly extend through the inorganic barrier film 3, the gate insulating film 16, the first inorganic insulating film 18, and the second inorganic insulating film 20. Although not illustrated in FIG. 17, the two end side slits 45 similarly extend through the inorganic barrier film 3, the gate insulating film 16, the first inorganic insulating film 18, and the second inorganic insulating film 20.

Figure 18:
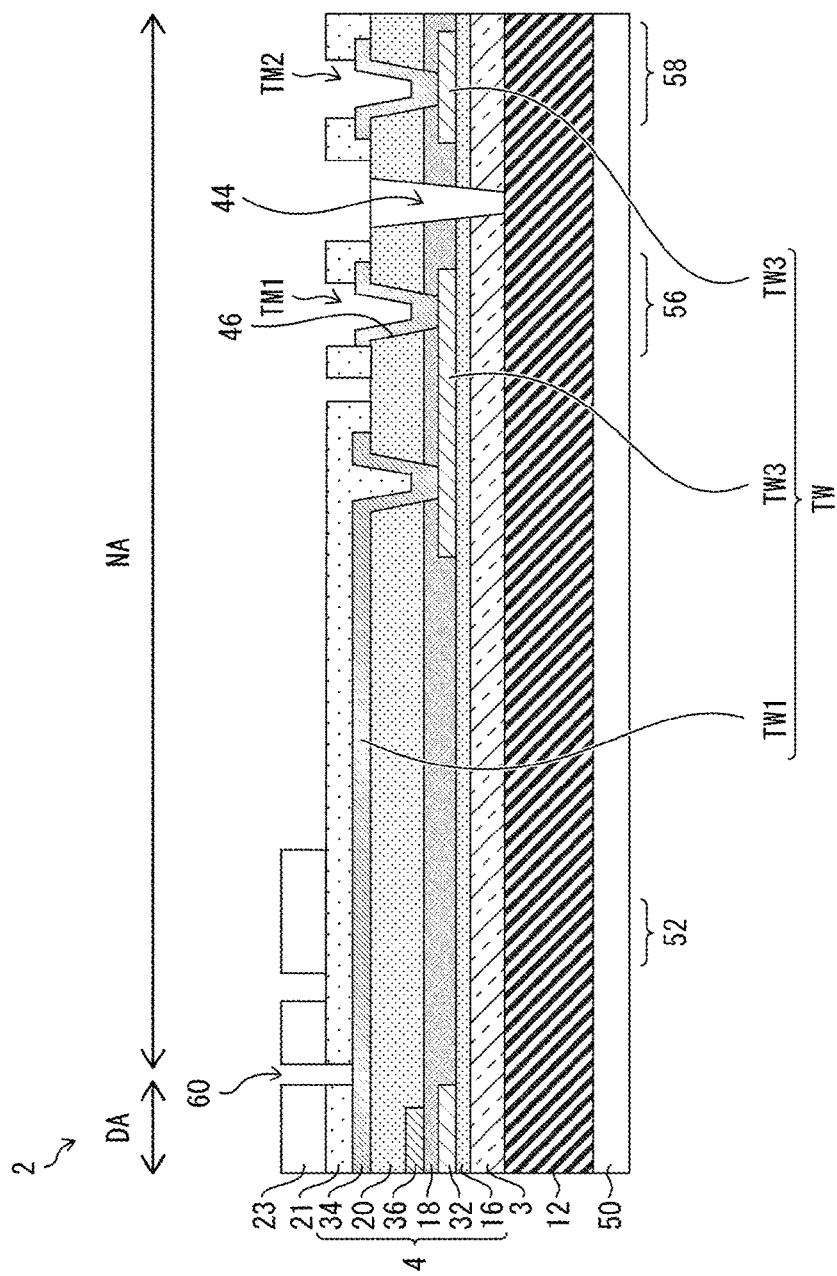
FIG. 18 is another cross-sectional view taken along B-B' line of FIG. 14, which illustrates a cross-sectional configuration of an EL device according to the other embodiment of the disclosure.

As illustrated in FIG. 18, the terminal wiring line TW includes the terminal side portion TW3 formed from the gate conductive layer 32 and the main body portion TW1 formed from only the source conductive layer 34. The terminal side portion TW3 of the terminal wiring line TW is provided in the IC chip mounted region 56 and the FPC connection region 58 and passes below the second inorganic film 20. Thus, the terminal TM1 can come into contact with the terminal wiring line TW inside the TFT layer 4. This prevents the terminal wiring line TW from being exposed in a region having no flattening film 21. The main body portion TW1 of each of the terminal wiring lines TW passes a gap between the island-like slits 42' included in the bending slit 42 and a gap between the island-like slits 43' included in the active side slit 43. Therefore, even in a case where the island-like slits 42' and 43' included in the bending slit 42 and the active side slit 43 have a sharp taper angle at their inner surfaces or have a large depth, the terminal wiring line TW is hardly disconnected.

The terminals TM1 and TM2 (*i*) similarly are in contact with the terminal side portion TW3 of the terminal wiring line TW through the contact hole 46 and (ii) each have an end covered with the flattening film 21 or the bank layer 23.

Step Sequence

The terminal wiring line TW and the slits 42', 43', and 44 of FIGS. 14, 17, and 18 can be formed in step 3 through the following step sequence. Note that although a description is omitted, the two end side slits 45 are formed through the same process as a process for the island-like slit 43' included in the active side slit 43 and the FPC side slit 44.

First, the semiconductor film 15 and the gate insulating film 16 are formed. Next, the gate conductive layer 32 is formed, and the terminal side portion TW3 of the terminal wiring line TW as well as the gate electrode are formed from the gate conductive layer. Subsequently, the first inorganic insulating film 18, the intermediate conductive layer 36, and the second inorganic insulating film 20 are formed. Next, the inorganic barrier film 3, the gate insulating film 16, the first inorganic insulating film 18, and the second inorganic insulating film 20 are etched so as to form the contact hole 46 for the terminals TM1 and TM2, the slits 42', 43', and 44, and contact hole for connection between the terminal side portion TW3 of the terminal wiring line TW and the main body portion TW1. After that, the source conductive layer 34 is formed, and the terminals TM1 and TM2 and the main body portion TW1 of the terminal wiring line TW as well as the source electrode S and the drain electrode D are formed from the source conductive layer 34. Subsequently, the flattening film 21 is formed.

The gate conductive layer 32 preferably functions as an etching stop layer.

Advantageous Effects

Accordingly, the EL device 2 having a configuration according to the eighth embodiment can provide the same effects as the EL device 2 having a configuration illustrated in FIG. 9.

Moreover, in the EL device 2 according to the eighth embodiment, the main body portion TW1 of the terminal wiring line TW (especially, a portion extending between the active region DA and the active side slit 43) is formed from the source conductive layer 34 having a lower resistance than that of the gate conductive layer 32. Thus, the EL device 2 according to the eighth embodiment allows a delay in data signal to reduce and in turn, ensures a large margin for design compared with the EL device 2 according to the seventh embodiment above.

Moreover, in the EL device 2 having the configuration according to the eighth embodiment, the bending slit 42 and the active side slit 43 can each include a plurality of aligned slit groups similar to the EL device 2 having the configuration according to the seventh embodiment above. The bending slit 42 including a plurality of aligned slit groups makes the EL device 2 more bendable at the bendable region 52 similar to the modified embodiment of the seventh embodiment. In addition, the active side slit 43 including a plurality of aligned slit groups allows the EL device 2 to have higher reliability similar to that of the modified embodiment of the seventh embodiment.

Alternatively, in the EL device 2 according to the eighth embodiment as well, the bending slit 42 being a single continuous slit and the active side slit 43 including one or more aligned slit groups can be combined. The bending slit 42 being a single continuous slit can reduce an effective width of the terminal portion 51 as well as can make the EL device 2 more bendable at the bendable region 52 similar to the modified embodiment of the seventh embodiment.

Ninth Embodiment

Step S3, considered as a feature of another embodiment of the disclosure, will be described hereinafter with reference to FIGS. 20A to 22. Note that step S9, considered as a feature of the present embodiment, is the same as step S9 by which the second embodiment is characterized, and therefore, its description is omitted here.

Figure 20A:
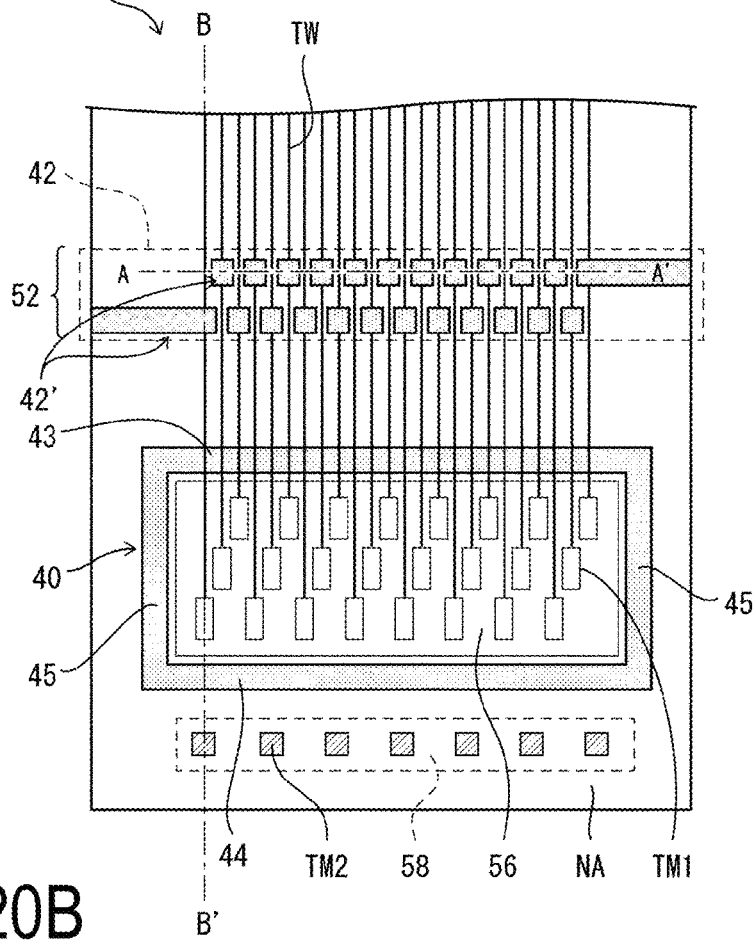
FIGS. 20A and 20B are plan views illustrating a configuration example of an EL device 2 according to another embodiment of the disclosure.
Figure 20B:
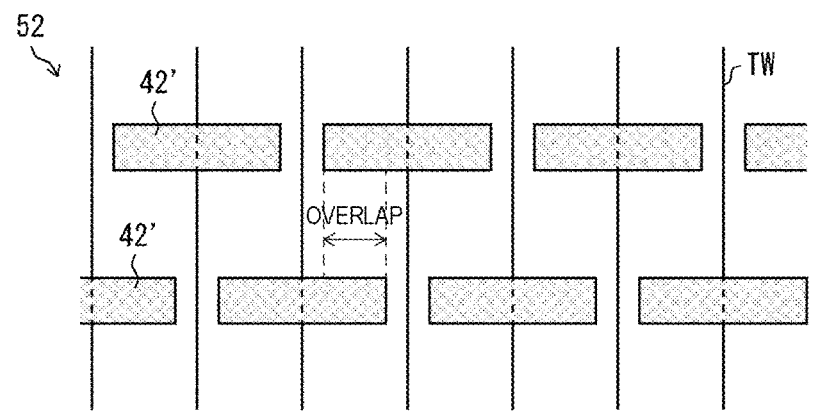
Figure 21:
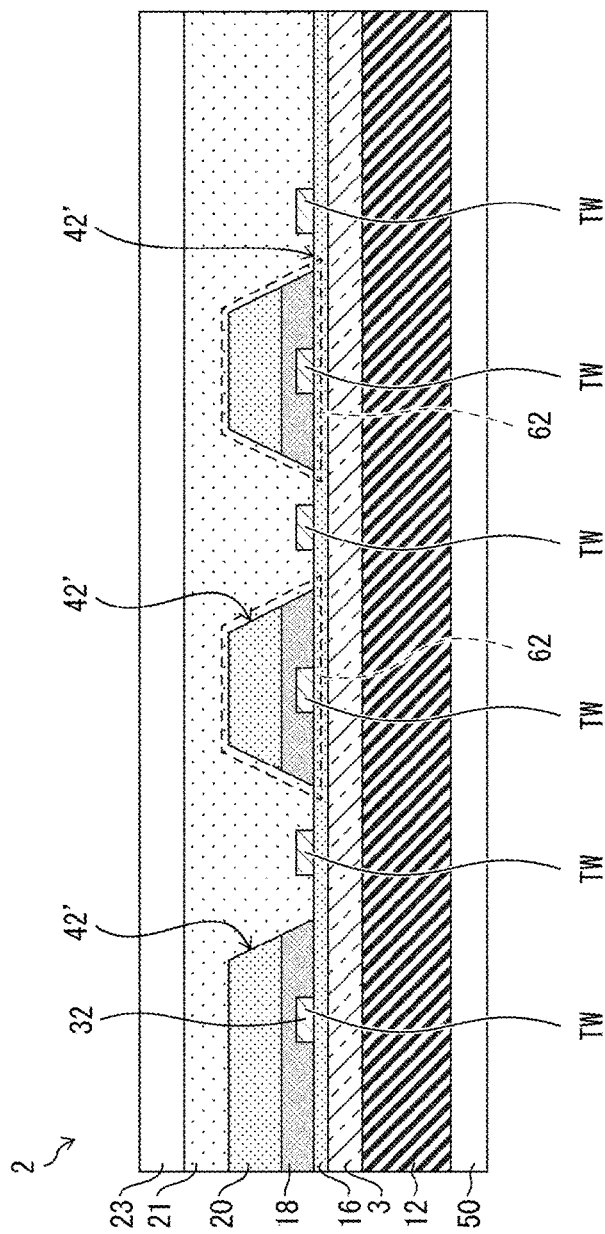
FIG. 21 is a cross-sectional view taken along A-A' line of FIG. 20A, which illustrates a cross-sectional configuration of an EL device according to the other embodiment of the disclosure.
Figure 22:
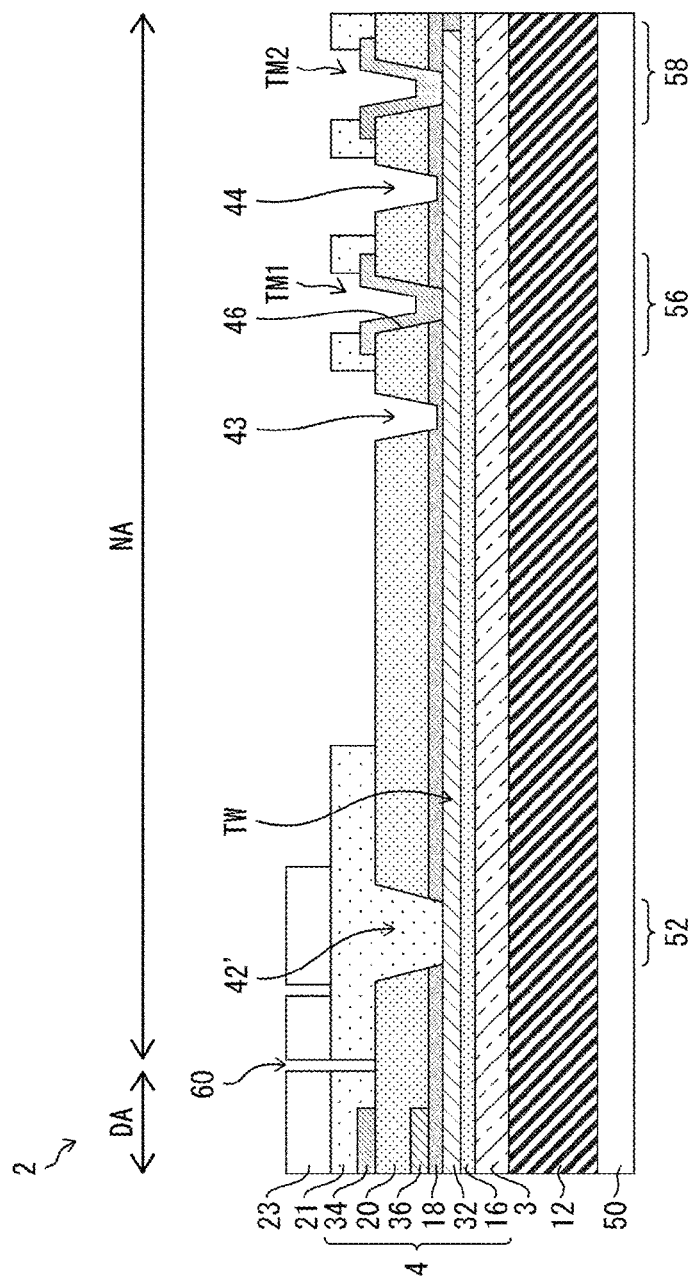
FIG. 22 is a cross-sectional view taken along B-B' line of FIG. 20A, which illustrates a cross-sectional configuration of an EL device according to the other embodiment of the disclosure.

FIG. 20A is a plan view illustrating a configuration example of the EL device 2 of the ninth embodiment. FIG. 20B is a partially enlarged view of the bendable region 52 illustrated in FIG. 20A. FIG. 21 is a cross-sectional view taken along line A-A' of FIG. 20A. FIG. 22 is a cross-sectional view taken along line B-B' of FIG. 20A.

As illustrated in FIGS. 20A and 20B, the bending slit 42 can include a plurality of island-like slits 42' each disposed so as to cross a corresponding terminal wiring line TW in a one-to-one correspondence instead of including a single continuous slit. For example, in a case where the bending slit 42 includes two aligned slit groups, (i) the island-like slits 42' of one aligned slit group are aligned in the direction crossing the direction in which the terminal wiring lines TW extend, so as to cross an odd number of terminal wiring lines TW in a one-to-one correspondence and (ii) the island-like slits 42' of the other aligned slit group are aligned in the direction crossing the direction in which the terminal wiring lines TW extend, so as to cross an even number of terminal wiring lines TW in a one-to-one correspondence, and (iii) the two aligned slit groups are arranged in the terminal wiring lines TW such that their island-like slits 42' are disposed alternately. Hence, as illustrated in FIG. 21, in portions between the island-like slits 42' crossing the even-numbered terminal wiring lines TW, banks 62 are formed covering the odd-numbered terminal wiring lines TW. Likewise, in portions between the island-like slits 42' crossing the odd-numbered terminal wiring lines TW, banks 62 are formed covering the even-numbered terminal wiring lines TW. Note that the island-like slits 42' and the terminal wiring lines TW can cross in other than a one-to-one correspondence. Each island-like slits 42' may cross one terminal wiring line TW, and each terminal wiring line TW may cross one or more island-like slits 42'. For example, one terminal wiring line TW can cross several island-like slits 42'.

Preferably, a plurality of island-like slits 42' constituting the bending slit 42 are arranged to form a plurality of aligned slit groups adjacent in the direction in which the terminal wiring lines TW extend. In this case, the island-like slits 42' included in different aligned slit groups can alternately cross the terminal wiring line TW. Preferably, the plurality of island-like slits 42' constituting the bending slit 42 are arranged so as to partially overlap each other as viewed from the direction in which the terminal wiring lines TW extend. In this case, every gap between the terminal wiring lines TW is blocked by a corresponding island-like slits 42' as viewed in the direction in which the terminal wiring lines TW extend.

Preferably, end portions (except the outermost end portion of the bending slit 42) of the island-like slits 42' of a plurality of aligned slit groups constituting the bending slit 42 overlap another island-like slits 42' included in the plurality of aligned slit group when viewed in the direction in which the terminal wiring lines TW extend. Preferably, the outermost end portion of the bending slit 42 reaches the outer periphery of the EL device 2. This prevents a crack from spreading through between the plurality of island-like slits 42' constituting the bending slit 42.

As illustrated in FIG. 22, the individual island-like slits 42' included in the bending slit 42 extend through the first inorganic insulating film 18 and the second inorganic insulating film 20. The terminal wiring lines TW are each formed from only the gate conductive layer 32. The terminal wiring lines TW each cross a corresponding island-like slit 42', passing through the bottom surface of the island-like slit 42'. To prevent the terminal wiring line TW from being exposed, each island-like slit 42 is filled with the flattening film 21.

As illustrated in FIGS. 20A to 21, the individual island-like slits 42' included in the bending slit 42 cross a single terminal wiring line TW. The island-like slits 42' included in the bending slit 42 are separated from one another by the banks 62 formed from the first inorganic insulating film 18 and the second inorganic insulating film 20. The upper surface of the bank 62 is the upper surface of the second inorganic insulating film 20 so that residues of the source conductive layer 34 is less likely to remain. Even in a case where the residues of the source conductive layer 34 remains on the bottom surfaces and inner surfaces of several island-like slits 42' included in the bending slit 42, the residues of the source conductive layer 34 does not remain on the upper surface of the banks 62 surrounding the island-like slits 42'. Therefore, since the configuration of the EL device 2 according to the ninth embodiment prevents the short-circuit failure through the residues of the source conductive layer 34 from occurring, it is preferred to perform etching for forming the island-like slits 42' and etching for forming the contact hole 46 at the same time.

Other than the aforementioned points regarding the island-like slits 42' included in the bending slit 42, the EL device 2 according to the ninth embodiment is the same as that of the second embodiment in terms of configuration and step sequence. Thus, their descriptions are omitted here.

Also, the active side slit 43 included in the IC chip outer circumferential slit 40 can similarly include a plurality of island-like slits 43' disposed to cross the terminal wiring lines TW in a one-to-one correspondence.

Advantageous Effects

The EL device 2 according to the ninth embodiment can provide the same effect as the EL device 2 having a configuration according to the second embodiment.

Supplement

A display device according to a first aspect of the disclosure includes: a TFT layer including a plurality of inorganic insulating films; and a light emitting element layer above the TFT layer, the TFT layer including a terminal region including a plurality of terminals, the terminal region being provided outside an active region. The display device includes a first slit pattern and a second slit pattern each extending through at least one of the plurality of inorganic insulating films, the first slit pattern is formed between the active region and the terminal region in plan view, and the terminal region is sandwiched between the first slit pattern and the second slit pattern in plan view.

According to a second aspect of the disclosure, the display device of the first aspect may be configured such that an IC chip is mounted on the terminal region.

According to a third aspect of the disclosure, the display device of the first or second aspect may be configured such that a flexible circuit board is connected between the second slit pattern and an edge of the display device in a plan view.

According to a fourth aspect of the disclosure, the display device of any one of the first to third aspects may be configured such that at least a part of the plurality of terminals are formed from a conductive layer above the plurality of inorganic insulating films.

According to a fifth aspect of the disclosure, the display device of any one of the first to fourth aspects may be configured such that the first slit pattern includes a continuous slit extending in a direction crossing a plurality of terminal wiring lines connected to the plurality of terminals.

According to a sixth aspect of the disclosure, the display device of the fifth aspect may further include a barrier layer below the TFT layer.

According to a seventh aspect of the disclosure, the display device of the sixth aspect may be configured such that the first slit pattern and the second slit pattern do not reach the barrier layer.

According to an eighth aspect of the disclosure, the display device of the seventh aspect may be configured such that the plurality of terminal wiring lines pass below the first slit pattern.

According to a ninth aspect of the disclosure, the display device of the eighth aspect may be configured such that the plurality of terminal wiring lines are formed in the same layer as a layer of a gate wiring of the TFT layer.

According to a tenth aspect of the disclosure, the display device of the sixth aspect may be configured such that the first slit pattern and the second slit pattern extend through the plurality of inorganic insulating films and reach the inside of the barrier layer, or extend through the plurality of inorganic insulating films and the barrier layer.

According to an eleventh aspect of the disclosure, the display device of the tenth aspect may be configured such that the plurality of terminal wiring lines pass an inner surface and a bottom surface of the first slit pattern.

According to a twelfth aspect of the disclosure, the display device of the tenth aspect may be configured such that the first slit pattern is filled with an organic insulating material, and the plurality of terminal wiring lines pass above the first slit pattern.

According to a thirteenth aspect of the disclosure, the display device of the eleventh or twelfth aspect may be configured such that a main body portion of each of the plurality of terminal wiring lines extending between the active region and the first slit pattern is formed in the same layer as a layer of the plurality of terminals.

According to a fourteenth aspect of the disclosure, the display device of the eleventh or twelfth aspect may be configured such that the plurality of terminal wiring lines include a main body portion (TW1) extending between the active region and the first slit pattern and a crossing portion (TW5) crossing the first slit pattern, and the main body portion and the crossing portion are formed from different conductive layers.

According to a fifteenth aspect of the disclosure, the display device of the eleventh or twelfth aspect may be configured such that the first slit pattern is tapered with a width of the first slit pattern being reduced toward a bottom.

According to a sixteenth aspect of the disclosure, the display device of any one of the first to fourth aspects may be configured such that the first slit pattern includes one or more aligned slit groups including a plurality of island-like slits arranged in a direction crossing the plurality of terminal wiring line connected to the plurality of terminals.

According to a seventeenth aspect of the disclosure, the display device of the sixteenth aspect may be configured such that the plurality of terminal wiring lines do not overlap the first slit pattern.

According to an eighteenth aspect of the disclosure, the display device of the seventeenth aspect may be configured such that the plurality of island-like slits of each of the one or more aligned slit groups are arranged with the plurality of terminal wiring lines pass between the plurality of island-like slits of each of the one or more aligned slit groups in a one-to-one correspondence.

According to a nineteenth aspect of the disclosure, the display device of the sixteenth aspect may be configured such that the plurality of island-like slits each cross only one of the plurality of terminal wiring lines.

According to a twentieth aspect of the disclosure, the display device of the nineteenth aspect may be configured such that the plurality of island-like slits are arranged while crossing the plurality of terminal wiring lines in a one-to-one correspondence.

According to a twenty-first aspect of the disclosure, the display device of any one of the seventeenth to twentieth aspects may be configured such that a barrier layer is provided below the TFT layer, and the first slit pattern extends through the plurality of inorganic insulating films and reach the inside of the barrier layer, or extends through the plurality of inorganic insulating films and the barrier layer.

According to a twenty-second aspect of the disclosure, the display device of any one of the sixteenth to twenty-first aspects may be configured such that the first slit pattern includes a plurality of island-like slit groups, and the plurality of island-like slits included in the plurality of island-like slit groups are arranged in a staggered manner in plan view while not forming a gap between the plurality of island-like slits as viewed from a direction in which the plurality of terminal wiring lines extend.

According to a twenty-third aspect of the disclosure, the display device of the twenty-second aspect may be configured such that an end of an island-like slit included in the plurality of island-like slits overlaps another island-like slit of the plurality of island-like slits as viewed from a direction in which the plurality of terminal wiring lines extend.

According to a twenty-fourth aspect of the disclosure, the display device of any one of the fifth to twenty-third aspects may be configured such that the terminal region is surrounded by the first slit pattern, the second slit pattern including a continuous slit, and two fourth slit patterns including a continuous slit extending in the same direction as the plurality of terminal wiring lines.

According to a twenty-fifth aspect of the disclosure, the display device of any one of the fifth to twenty-fourth aspects may be configured such that a bendable region is formed between the active region and the first slit pattern, and a third slit pattern is formed in the bendable region while extending through at least one of the plurality of inorganic insulating films.

According to a twenty-sixth aspect of the disclosure, the display device of the twenty-fifth aspect may be configured such that the first slit pattern and the third slit pattern have the same depth.

According to a twenty-seventh aspect of the disclosure, the display device of the twenty-sixth aspect may be configured such that the first slit pattern and the third slit pattern have the same slit pattern.

According to a twenty-eighth aspect of the disclosure, the display device of the twenty-sixth or twenty-seventh aspect may be configured such that a barrier layer is provided below the TFT layer, a support member is provided below the barrier layer, the first slit pattern and the third slit pattern extend through the plurality of inorganic insulating films and the barrier layer, reach the support member, and also are filled with an organic insulating material, and the plurality of terminal wiring lines pass above the organic insulating material.

According to a twenty-ninth aspect of the disclosure, the display device of any one of the twenty-fifth to twenty-eighth aspects may include a sealing layer covering the light emitting element layer. The display device is of an upward light emission type device configured to allow light emitted from the light emitting element layer to pass through the sealing layer and is bent along the third slit pattern as a hold with the surface of the plurality of terminals facing downward.

According to a thirtieth aspect of the disclosure, the display device of any one of the fifth to twenty-ninth aspect may be configured such that at least a part of the plurality of terminal wiring lines is formed from a conductive layer above the plurality of inorganic insulating films and also covered with an organic insulating film above the TFT layer.

According to a thirty-first aspect of the disclosure, the display device of any one of the first to thirtieth aspects may include a flexible support member.

A method for manufacturing a display device according to a thirty-second aspect of the disclosure is a method for manufacturing a display device including a TFT layer including a plurality of inorganic insulating films and a light emitting element layer above the TFT layer, the TFT layer including a terminal region including a plurality of terminals, the terminal region being provided outside an active region. The method including: forming a first slit pattern extending through at least one of the plurality of inorganic insulating films, between the active region and the terminal region in plan view; and forming a second slit pattern extending through at least one of the plurality of inorganic insulating films so as to sandwich the terminal region together with the first slit pattern in plan view.

According to a thirty-third aspect of the disclosure, the method for manufacturing a display device of the thirty-second aspect may be such that a third slit pattern extending through at least one of the plurality of inorganic insulating films is formed between the active region and the first slit pattern.

According to a thirty-fourth aspect of the disclosure, the method for manufacturing a display device of thirty-third aspect may be such that the first slit pattern and the third slit pattern are formed through the same process.

According to a thirty-fifth aspect of the disclosure, the method for manufacturing a display device of any one of the thirty-second to thirty-fourth aspects may be such that an electronic circuit board is mounted on the terminal region by thermocompression bonding.

According to a thirty-sixth aspect of the disclosure, the method for manufacturing a display device of the thirty-third or thirty-fourth aspect may be such that the display device is bent along the third slit pattern so that the terminal region is provided on the rear side.

A manufacturing apparatus configured to manufacture a display device according to a thirty-seventh aspect of the disclosure is a manufacturing apparatus configured to manufacture a display device including a TFT layer including a plurality of inorganic insulating films and a light emitting element layer above the TFT layer, the TFT layer including a terminal region including a plurality of terminals, the terminal region being provided outside an active region. The manufacturing apparatus is configured to form a first slit pattern extending through at least one of the plurality of inorganic insulating films, between the active region and the terminal region in plan view, and to form a second slit pattern extending through at least one of the plurality of inorganic insulating films while sandwiching the terminal region together with the first slit pattern in plan view.

Additional Items

The disclosure is not limited to the embodiments stated above. Embodiments obtained by appropriately combining technical approaches stated in each of the different embodiments also fall within the scope of the technology of the disclosure. Moreover, novel technical features may be formed by combining the technical approaches stated in each of the embodiments.

Figure 23:
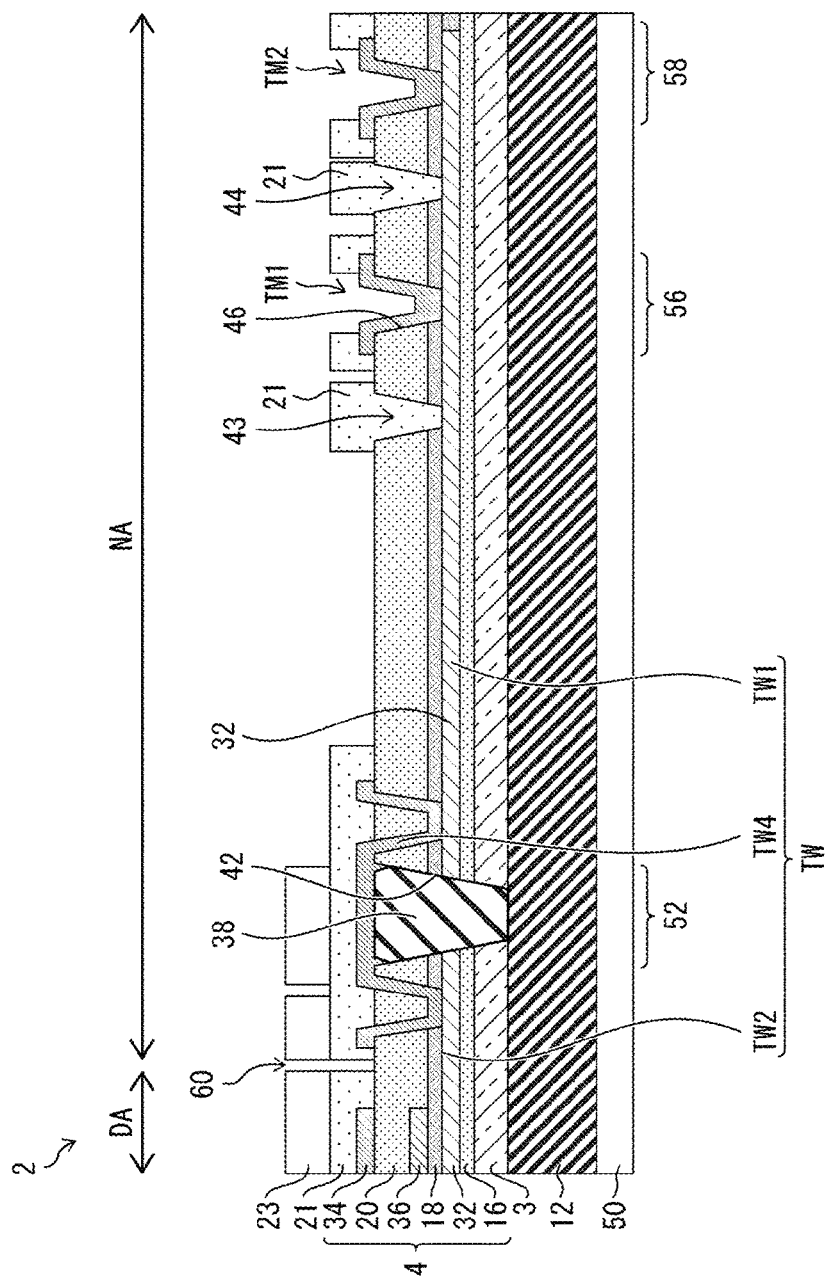
FIG. 23 is a cross-sectional view illustrating a configuration example obtained by combining configurations of EL devices according to several embodiments of the disclosure.

For example, the technical scope of the disclosure encompasses a configuration obtained by combining the configuration according to the first embodiment and the configuration according to the fourth embodiment as illustrated in FIG. 23.

FIG. 23 is a cross-sectional view illustrating a configuration example obtained by combining the configuration in which the gate conductive layer 32 is exposed at the bottom surface of the IC chip outer circumferential slit 40 of the EL device 2 (see FIG. 5) according to the first embodiment and the configuration of the EL device 2 (see FIG. 11) according to the fourth embodiment at the bendable region 52 and its surroundings. The bending slit 42 of FIG. 23 extends through the inorganic barrier layer 3, the gate conductive layer 32, and the plurality of inorganic insulating films 16, 18, and 20. The active side slit 43 and the FPC side slit 44 of FIG. 23 extend through the first and second inorganic insulating films 18 and 20.

REFERENCE SIGNS LIST

2 EL device
4 TFT layer
3 Inorganic barrier film (barrier layer)
5 Light emitting element layer
6 Sealing layer
7 Layered body
8, 11 Adhesive layer
9 Protection member
10 Support member
12 Resin layer (flexible support member)
13 Peeling layer
15 Semiconductor layer
16 Gate insulating film
16, 18, 20 Inorganic insulating film
21 Flattening film
22 Anode electrode
23 Bank layer
23b Bank
23c Partition
24 EL layer
25 Cathode electrode
26 First inorganic sealing film
26, 28 Inorganic sealing film
27 Organic sealing film
28 Second inorganic sealing film
32 Gate conductive layer
34 Source conductive layer
36 Intermediate conductive layer
32, 34, 36 Conductive layer
38 Buried material (organic insulating material)
40 IC chip outer circumferential slit
42 Bending slit (third slit pattern)
42' Island-like slit
43 Active side slit (first slit pattern)
43' Island-like slit
44 FPC side slit (second slit pattern)
45 End side slit (fourth slit pattern)
46 Contact hole
50 Mother substrate
51 Terminal portion
52 Bendable region (bending region)
56 IC chip mounted region (terminal region)
58 FPC connection region
60 Slit
62 Bank
DA Active region
NA Non-active region
TM, TM1, TM2 Terminal
TW Terminal wiring line
TW1 Main body portion
TW2 Active side portion
TW3 Terminal side portion
TW4 Bending slit bridge portion (crossing portion)
TW5 Outer circumferential slit bridge portion (crossing portion)

The invention claimed is:

1. A display device comprising:
a thin-film transistor (TFT) layer including a plurality of inorganic insulating films; and
a light emitting element layer above the TFT layer, the TFT layer including a terminal region including a plurality of terminals, the terminal region being provided outside an active region, wherein
the plurality of inorganic insulating films includes a first inorganic insulating film, and a second inorganic insulating film above the first inorganic insulating film,
the display device includes a first slit pattern and a second slit pattern each extending through the second inorganic insulating film and exposing the first inorganic insulating film,
neither the first slit pattern nor the second slit pattern extends through the first inorganic insulating film,
the first slit pattern is between the active region and the terminal region in a plan view,
the terminal region is sandwiched between the first slit pattern and the second slit pattern in the plan view, and
in the plan view, the first inorganic insulating film includes a first portion exposed from the first slit pattern and a second portion exposed from the second slit pattern, the first portion making contact with and covering, from above, a portion of a first terminal wiring line connected to any one of the plurality of terminals, the first terminal wiring line extending toward the active region and crossing the first slit pattern, and the second portion making contact with and covering, from above, a portion of a second terminal wiring line connected to any one of the plurality of terminals, the second terminal wiring line crossing the second slit pattern.

2. The display device according to claim 1, wherein an IC chip is mounted on the terminal region.

3. The display device according to claim 1, wherein the second slit pattern is between a flexible circuit board connected to the second terminal wiring line and the terminal region.

4. The display device according to claim 1, wherein at least a portion of the plurality of terminals is made from a conductive layer above the plurality of inorganic insulating films.

5. The display device according to claim 1, wherein the first slit pattern includes a continuous slit extending in a direction crossing the first terminal wiring line.

6. The display device according to claim 5 further comprising:
a barrier layer below the TFT layer.

7. The display device according to claim 6, wherein the first slit pattern and the second slit pattern do not reach the barrier layer.

8. The display device according to claim 7, wherein the first terminal wiring line passes below the first slit pattern.

9. The display device according to claim 8, wherein the first terminal wiring line is in a same layer as a layer of a gate wiring line of the TFT layer.

10. The display device according to claim 5, wherein
the terminal region is surrounded by the first slit pattern,
the second slit pattern including a continuous slit, and
two fourth slit patterns including a continuous slit extending in a same direction as the plurality of terminal wiring lines.

11. The display device according to claim 5, wherein
a bendable region is between the active region and the first slit pattern, and
a third slit pattern is in the bendable region and extends through at least one of the plurality of inorganic insulating films.

12. The display device according to claim 1, wherein the first slit pattern includes one or more aligned slit groups including a plurality of island-shaped slits arranged in a direction crossing the plurality of terminal wiring lines connected to the plurality of terminals.

13. The display device according to claim 12, wherein the plurality of terminal wiring lines do not overlap the first slit pattern.

14. The display device according to claim 13, wherein the plurality of island-shaped slits of each of the one or more aligned slit groups are arranged with the plurality of terminal wiring lines passing between the plurality of island-shaped slits constituting each of the one or more aligned slit groups in a one-to-one correspondence.

15. A display device comprising:
a thin-film transistor (TFT) layer including a plurality of inorganic insulating films;
a barrier layer below the TFT layer;
a light emitting element layer above the TFT layer; and
a first slit pattern and a second slit pattern each extending through at least one of the plurality of inorganic insulating films, wherein the TFT layer includes a terminal region including a plurality of terminals, the terminal region being provided outside an active region,
the first slit pattern is between the active region and the terminal region in a plan view,
the terminal region is sandwiched between the first slit pattern and the second slit pattern in the plan view,
the first slit pattern includes a continuous slit extending in a direction crossing the first terminal wiring line, and
the first slit pattern and the second slit pattern extend through the plurality of inorganic insulating films and expose an inside of the barrier layer, or extend through the plurality of inorganic insulating films and the barrier layer.

16. The display device according to claim 15, wherein the plurality of terminal wiring lines pass an inner surface and a bottom surface of the first slit pattern.

17. The display device according to claim 16, wherein a main body portion of each of the plurality of terminal wiring lines extending between the active region and the first slit pattern is in a same layer as a layer of the plurality of terminals.

18. The display device according to claim 16, wherein
each of the plurality of terminal wiring lines includes a main body portion extending between the active region and the first slit pattern and a crossing portion crossing the first slit pattern, and
the main body portion and the crossing portion are made from different conductive layers.

19. The display device according to claim 16, wherein the first slit pattern is tapered with a width of the first slit pattern being reduced toward a bottom.

20. The display device according to claim 15, wherein
the first slit pattern is filled with an organic insulating material, and
the plurality of terminal wiring lines pass above the organic insulating material.

* * * * *